(12) United States Patent
Kato et al.

(10) Patent No.: US 12,412,730 B2
(45) Date of Patent: Sep. 9, 2025

(54) MULTI-CHARGED PARTICLE BEAM WRITING APPARATUS AND MULTI-CHARGED PARTICLE BEAM WRITING METHOD

(71) Applicant: NuFlare Technology, Inc., Yokohama (JP)

(72) Inventors: Yasuo Kato, Yokohama (JP); Ryoh Kawana, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 513 days.

(21) Appl. No.: 18/057,471

(22) Filed: Nov. 21, 2022

(65) Prior Publication Data

US 2023/0095091 A1 Mar. 30, 2023

Related U.S. Application Data

(63) Continuation of application No. PCT/JP2021/010563, filed on Mar. 16, 2021.

(30) Foreign Application Priority Data

Jun. 12, 2020 (JP) ................................. 2020-102168

(51) Int. Cl.
*H01J 37/304* (2006.01)
*G03F 1/78* (2012.01)
(Continued)

(52) U.S. Cl.
CPC .............. *H01J 37/304* (2013.01); *G03F 1/78* (2013.01); *G03F 7/2061* (2013.01); *H01J 37/3177* (2013.01)

(58) Field of Classification Search
CPC ................. H01J 37/304; H01J 37/3177; H01J 2237/31761; H01J 2237/31774;
(Continued)

(56) References Cited

U.S. PATENT DOCUMENTS 9,269,543 B2 2/2016 Reiter et al.
10,020,165 B2 * 7/2018 Matsumoto ......... H01J 37/3177
(Continued)

FOREIGN PATENT DOCUMENTS

CN 109585246 B 9/2021
JP 2015-165565 A 9/2015
(Continued)

OTHER PUBLICATIONS

International Search Report issued May 25, 2021 in PCT/JP2021/010563 filed Mar. 16, 2021, 2 pages.
(Continued)

*Primary Examiner* — Stewart A Fraser
(74) *Attorney, Agent, or Firm* — Oblon, McClelland, Maier &Neustadt, L.L.P.

(57) ABSTRACT

A multi-charged particle beam writing apparatus includes a circuit to allocate an additional dose to a position inside a writing target pattern in order to change a first dose distribution by an excessive dose, generated on the target object by applying, in the multi-charged particle beams, an excessive dose defective beam, to a second dose distribution whose center is located inside the writing target pattern and for which beam irradiation canceling out the excessive dose and being in a range of the first dose distribution exists; and a circuit to perform correction by subtracting an increased dose amount, generated at the center of the second dose distribution because of the additional dose being allocated, from a dose with which one of the center of the second dose distribution and a vicinity of the center of the second dose distribution is irradiated.

10 Claims, 19 Drawing Sheets

(51) Int. Cl.
*G03F 7/20* (2006.01)
*H01J 37/317* (2006.01)

(58) Field of Classification Search
CPC .. H01J 2237/31793; H01J 2237/24514; G03F 1/78; G03F 7/2061; H01L 21/027
See application file for complete search history.

(56) References Cited

U.S. PATENT DOCUMENTS

| | | |
|---|---|---|
| 10,453,652 B2 | 10/2019 | Matsumoto |
| 10,916,406 B2 | 2/2021 | Matsumoto |
| 2017/0103869 A1* | 4/2017 | Matsumoto ......... H01J 37/3177 |
| 2017/0229280 A1 | 8/2017 | Kato et al. |
| 2019/0103252 A1 | 4/2019 | Kakehi et al. |
| 2019/0304749 A1 | 10/2019 | Yoshikawa et al. |
| 2022/0107569 A1 | 4/2022 | Kato et al. |

FOREIGN PATENT DOCUMENTS

| | | |
|---|---|---|
| JP | 2017-143235 A | 8/2017 |
| JP | 2018-137358 A | 8/2018 |
| JP | 2019-33117 A | 2/2019 |
| JP | 2019-176047 A | 10/2019 |
| JP | 2020-21919 A | 2/2020 |
| JP | 2022-61181 A | 4/2022 |
| TW | 202020924 A | 6/2020 |

OTHER PUBLICATIONS

Taiwanese Office Action mailed on Mar. 9, 2022 for Taiwanese Application No. 110113885, 12 pages (with English Translation).

* cited by examiner

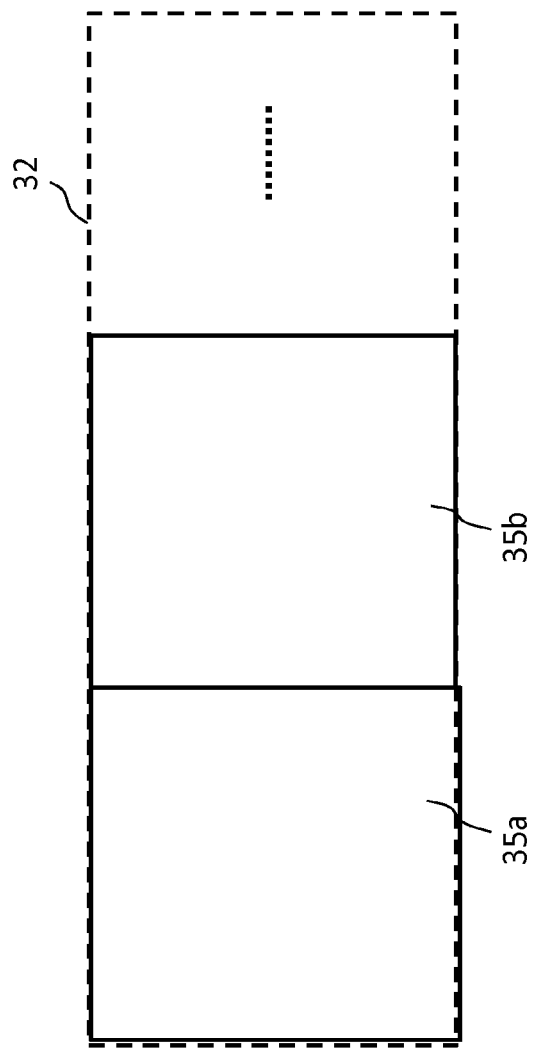
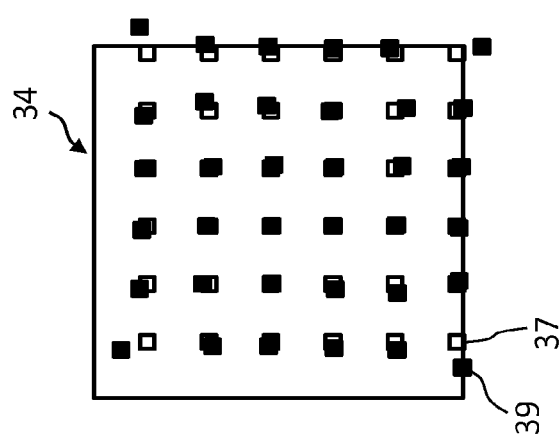
FIG.10B
FIG.10A

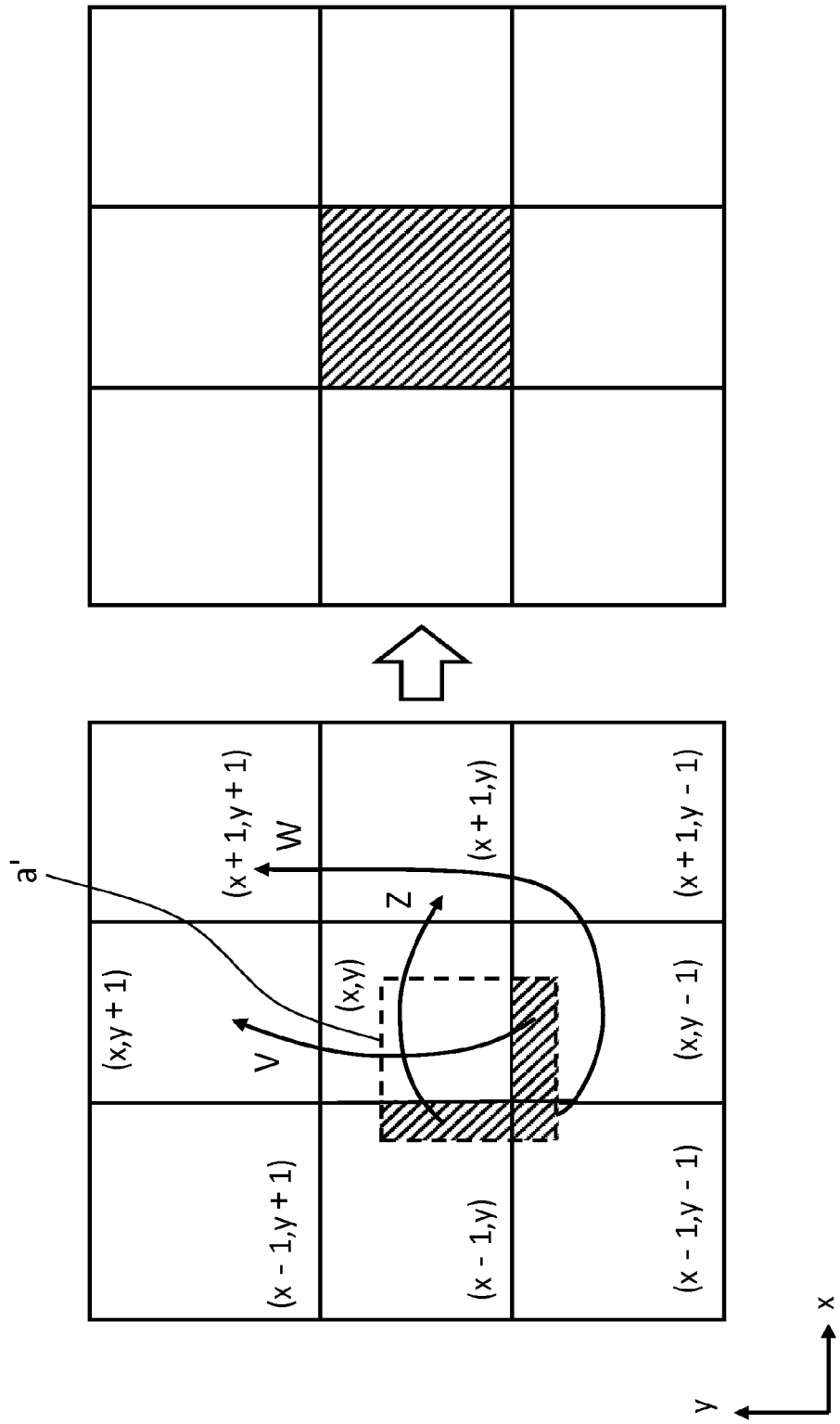

MULTI-CHARGED PARTICLE BEAM WRITING APPARATUS AND MULTI-CHARGED PARTICLE BEAM WRITING METHOD

CROSS-REFERENCE TO RELATED APPLICATION

This application is a continuation application based upon and claims the benefit of priority from prior Japanese Patent Application No. 2020-102168 (application number) filed on Jun. 12, 2020 in Japan, and International Application PCT/JP2021/010563, the International Filing Date of which is Mar. 16, 2021. The contents described in JP2020-102168 and PCT/JP2021/010563 are incorporated herein by reference.

BACKGROUND OF THE INVENTION

Field of the Invention

An embodiment of the present invention relates to a multi-charged particle beam writing apparatus and a multi-charged particle beam writing method, and for example, to a method for reducing pattern dimension deviation in multiple beam writing.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly narrower year by year. Thus, the electron beam writing technique which intrinsically has excellent resolution is used for writing or "drawing" a mask pattern on a mask blank with electron beams.

For example, as a known example of employing the electron beam writing technique, there is a writing apparatus using multiple beams. Since it is possible for multiple beam writing to apply multiple beams at a time, the writing throughput can be greatly increased in comparison with single electron beam writing. For example, a writing apparatus employing the multiple beam system forms multiple beams by letting portions of an electron beam emitted from an electron gun individually pass through a corresponding one of a plurality of holes in a mask, performs blanking control for respective formed beams, reduces by an optical system each beam that was not blocked in the blanking process to reduce a mask image, and deflects the reduced beam by a deflector to irradiate a desired position on a target object or "sample".

In multiple beam writing, the dose of each beam is controlled based on the irradiation time. However, since it may be difficult to control the irradiation time due to failures of a blanking control mechanism, etc., a defective beam that irradiates a target object with an excessive dose more than a desired dose may be generated. For example, an "always ON" beam (or beam being always ON) is a representative case. If a target object is irradiated with an excessive dose, a problem occurs that a shape error of a pattern formed on the target object is generated. To solve this problem, a method has been proposed in which the same dose amount as an excessive dose resulting from a defective beam is shared by peripheral beams of the defective beam in order to perform irradiation while subtracting a distributed dose amount from the dose of each of peripheral beams. However, with respect to the case where positions located outside the end of a pattern to be written are irradiated with always-on beams, a problem arises that because many of the peripheral beams are located outside the end of the pattern, and the dose (irradiation amount) of each of the positions located outside the end of the pattern is originally zero, it is difficult to share the excessive dose by the peripheral beams (e.g., refer to Japanese Patent Application Laid-open (JP-A) No. 2020-021919).

BRIEF SUMMARY OF THE INVENTION

According to one aspect of the present invention, a multi-charged particle beam writing apparatus includes
  a beam forming mechanism configured to form multi-charged particle beams;
  a dose calculation circuit configured to calculate a dose at each position on a target object;
  an additional dose allocation circuit configured to allocate an additional dose to a position inside a writing target pattern in order to change a first dose distribution by an excessive dose, generated on the target object by applying, in the multi-charged particle beams, an excessive dose defective beam whose irradiation dose is excessive because a beam dose cannot be controlled to a position where a dose for cancelling out the excessive dose is insufficient in a range of the excessive dose being spread, to a second dose distribution whose center is located inside the writing target pattern and for which beam irradiation canceling out the excessive dose and being in a range of the first dose distribution exists;
  a correction circuit configured to perform correction by subtracting an increased dose amount, generated at the center of the second dose distribution because of the additional dose being allocated, from a dose with which one of the center of the second dose distribution and a vicinity of the center of the second dose distribution is irradiated; and
  a writing mechanism configured to write a pattern on the target object, using the multi-charged particle beams including the excessive dose defective beam.

According to another aspect of the present invention, a multi-charged particle beam writing method includes
  forming multi-charged particle beams;
  calculating a dose at each position on a target object;
  allocating an additional dose to a position inside a writing target pattern in order to change a first dose distribution by an excessive dose, generated on the target object by applying, in the multi-charged particle beams, an excessive dose defective beam whose irradiation dose is excessive because a beam dose cannot be controlled to a position where a dose for cancelling out the excessive dose is insufficient in a range of the excessive dose being spread, to a second dose distribution whose center is located inside the writing target pattern and for which beam irradiation canceling out the excessive dose and being in a range of the first dose distribution exists;
  correcting by subtracting an increased dose amount, generated at the center of the second dose distribution because of the additional dose being allocated, from a dose with which one of the center of the second dose distribution and a vicinity of the center of the second dose distribution is irradiated; and writing a pattern on the target object, using the multi-charged particle beams including the excessive dose defective beam.

BRIEF DESCRIPTION OF THE DRAWINGS

FIGS. 10A and 10B are illustrations showing a beam position deviation and a position deviation periodicity according to the first embodiment;

FIGS. 11A and 11B are illustrations showing an example of a method for correcting a position deviation according to the first embodiment;

DETAILED DESCRIPTION OF THE INVENTION

In multiple beam writing, when a position outside the end of a pattern is irradiated with an excessive dose defective beam, an apparatus and method according to embodiments described herein can reduce, by a simple method, pattern shape errors due to the defective beam.

Embodiments below describe a configuration in which an electron beam is used as an example of a charged particle beam. The charged particle beam is not limited to the electron beam, and other charged particle beam such as an ion beam may also be used.

First Embodiment

Figure 1:
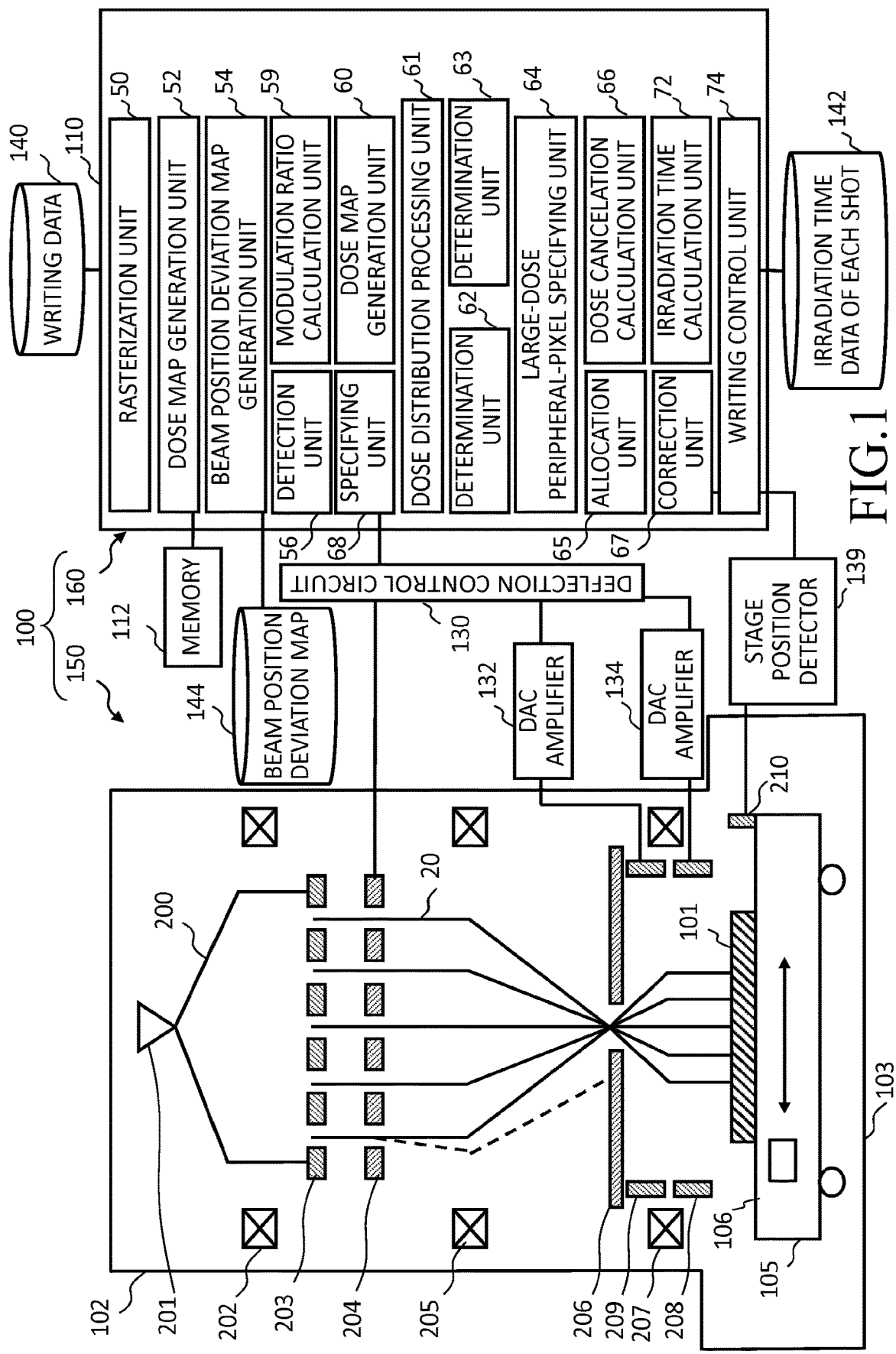
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multi-charged particle beam writing apparatus. The writing mechanism 150 includes an electron beam column 102 (multi-electron beam column) and a writing chamber 103. In the electron beam column 102, there are disposed an electron gun 201, an illumination lens 202, a shaping aperture array substrate 203, a blanking aperture array mechanism 204, a reducing lens 205, a limiting aperture substrate 206, an objective lens 207, a deflector 208, and a deflector 209. In the writing chamber 103, an XY stage 105 is disposed. On the XY stage 105, there is placed a target object or "sample" 101 such as a mask blank, on which resist has been applied, serving as a writing target substrate when writing is performed. The target object 101 is, for example, an exposure mask used when fabricating semiconductor devices, or a semiconductor substrate (silicon wafer) for fabricating semiconductor devices. Further, on the XY stage 105, a mirror 210 for measuring the position of the XY stage 105 is placed. Furthermore, a Faraday cup 106 is placed on the XY stage 105.

The control system circuit 160 includes a control computer 110, a memory 112, a deflection control circuit 130, DAC (digital-analog converter) amplifier units 132 and 134, a stage position detector 139, and storage devices 140, 142, and 144 such as magnetic disk drives. The control computer 110, the memory 112, the deflection control circuit 130, the DAC amplifier units 132 and 134, the stage position detector 139, and the storage devices 140, 142, and 144 are connected to each other through a bus (not shown). The DAC amplifier units 132 and 134 and the blanking aperture array mechanism 204 are connected to the deflection control circuit 130. Outputs of the DAC amplifier unit 132 are connected to the deflector 209. Outputs of the DAC amplifier unit 134 are connected to the deflector 208. The deflector 208 is composed of at least four electrodes (or "poles"), and controlled by the deflection control circuit 130 through a corresponding amplifier of the DAC amplifier unit 134 disposed for each electrode. The deflector 209 is composed of at least four electrodes (or "poles"), and controlled by the deflection control circuit 130 through a corresponding amplifier of the DAC amplifier unit 132 disposed for each electrode. The stage position detector 139 emits laser lights to the mirror 210 on the XY stage 105, and receives a reflected light from the mirror 210. The stage position detector 139 measures the position of the XY stage 105, based on the principle of laser interferometry which uses information of the reflected light.

In the control computer 110, there are arranged a rasterization unit 50, a dose map generation unit 52, a beam position deviation map generation unit 54, a detection unit 56, a modulation ratio (or factor) calculation unit 59, a dose map generation unit 60, a dose distribution processing unit

61, a determination unit 62, a determination unit 63, a large-dose peripheral-pixel specifying unit 64, an allocation unit 65, a dose cancelation calculation unit 66, a correction unit 67, a specifying unit 68, an irradiation time calculation unit 72, and a writing control unit 74. Each of the " . . . units" such as the rasterization unit 50, the dose map generation unit 52, the beam position deviation map generation unit 54, the detection unit 56, the modulation ratio calculation unit 59, the dose map generation unit 60, the dose distribution processing unit 61, the determination unit 62, the determination unit 63, the large-dose peripheral-pixel specifying unit 64, the allocation unit 65, the dose cancelation calculation unit 66, the correction unit 67, the specifying unit 68, the irradiation time calculation unit 72, and the writing control unit 74 includes processing circuitry. The processing circuitry includes, for example, an electric circuit, computer, processor, circuit board, quantum circuit, or semiconductor device. Each " . . . unit" may use common processing circuitry (the same processing circuitry), or different processing circuitry (separate processing circuitry). Information input/output to/from the rasterization unit 50, the dose map generation unit 52, the beam position deviation map generation unit 54, the detection unit 56, the modulation ratio calculation unit 59, the dose map generation unit 60, the dose distribution processing unit 61, the determination unit 62, the determination unit 63, the large-dose peripheral-pixel specifying unit 64, the allocation unit 65, the dose cancelation calculation unit 66, the correction unit 67, the specifying unit 68, the irradiation time calculation unit 72, and the writing control unit 74, and information being operated are stored in the memory 112 each time.

Writing data is input from the outside of the writing apparatus 100, and stored in the storage device 140. The writing data generally defines information on a plurality of figure patterns to be written. Specifically, it defines a figure code, coordinates, size, etc. of each figure pattern.

FIG. 1 shows a configuration necessary for describing the first embodiment. Other configuration elements generally necessary for the writing apparatus 100 may also be included therein.

Figure 2:
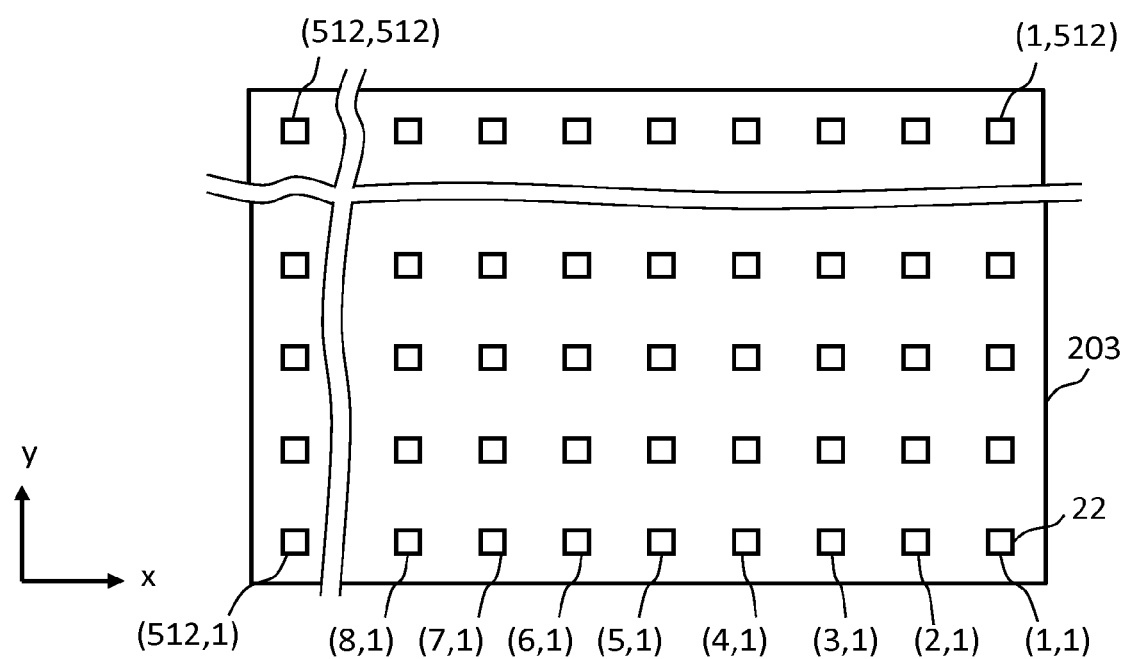
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 2, for example, holes (openings) 22 of 512×512, that is 512 (rows of holes arrayed in the y direction)×512 (columns of holes arrayed in the x direction), are formed. Each of the holes 22 is rectangular, including square, having the same dimension and shape as each other. Alternatively, each of the holes 22 may be a circle with the same diameter as each other. The shaping aperture array substrate 203 (beam forming mechanism) forms the multiple beams 20. Specifically, the multiple beams 20 are formed by letting portions of the electron beam 200 individually pass through a corresponding one of a plurality of holes 22. The method of arranging the holes 22 is not limited to the case of FIG. 2 where the holes are arranged like a grid in the width and length directions. For example, with respect to the x-direction kth and (k+1)th rows which are arrayed in the length direction (in the y direction), each hole in the kth row and each hole in the (k+1)th row may be arranged mutually displaced in the width direction (in the x direction) by a dimension "a". Similarly, with respect to the x-direction (k+1)th and (k+2)th rows which are arrayed in the length direction (in the y direction), each hole in the (k+1)th row and each hole in the (k+2)th row may be arranged mutually displaced in the width direction (in the x direction) by a dimension "b".

Figure 3:
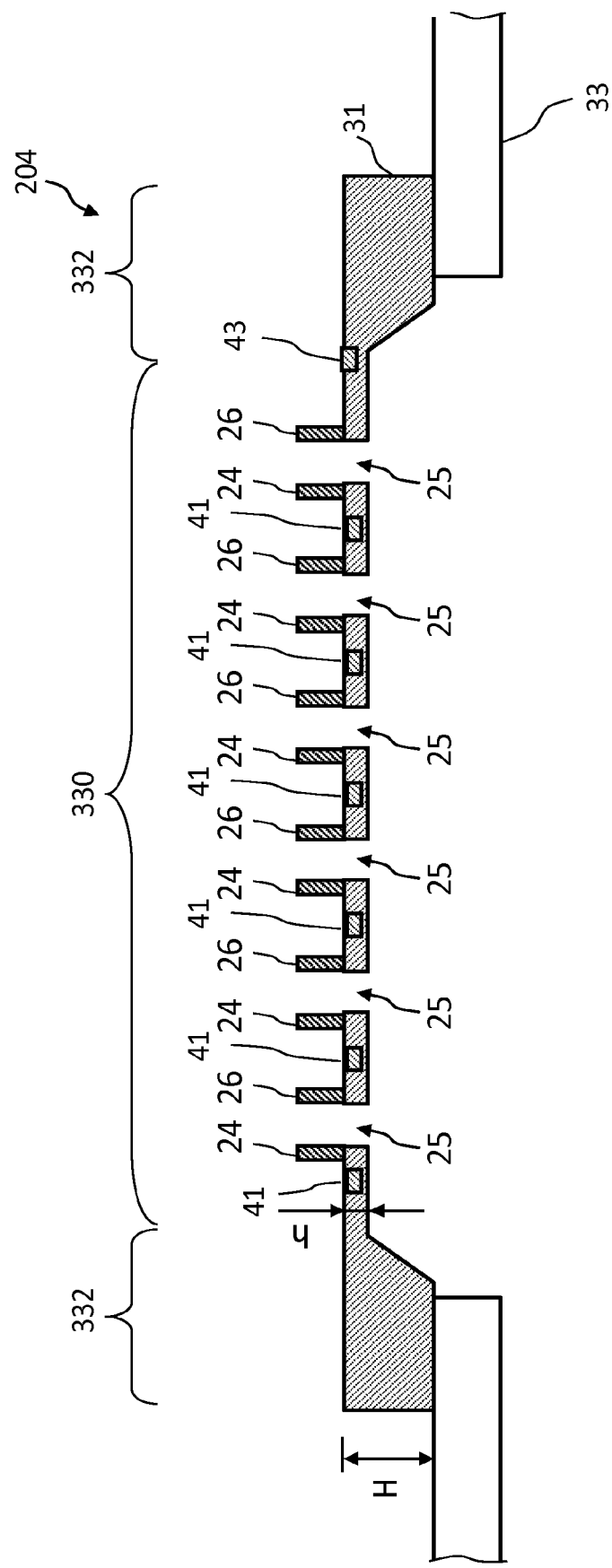
FIG. 3 is a sectional view showing a configuration of a blanking aperture array mechanism according to the first embodiment.

FIG. 3 is a sectional view showing a configuration of a blanking aperture array mechanism according to the first embodiment.

Figure 4:
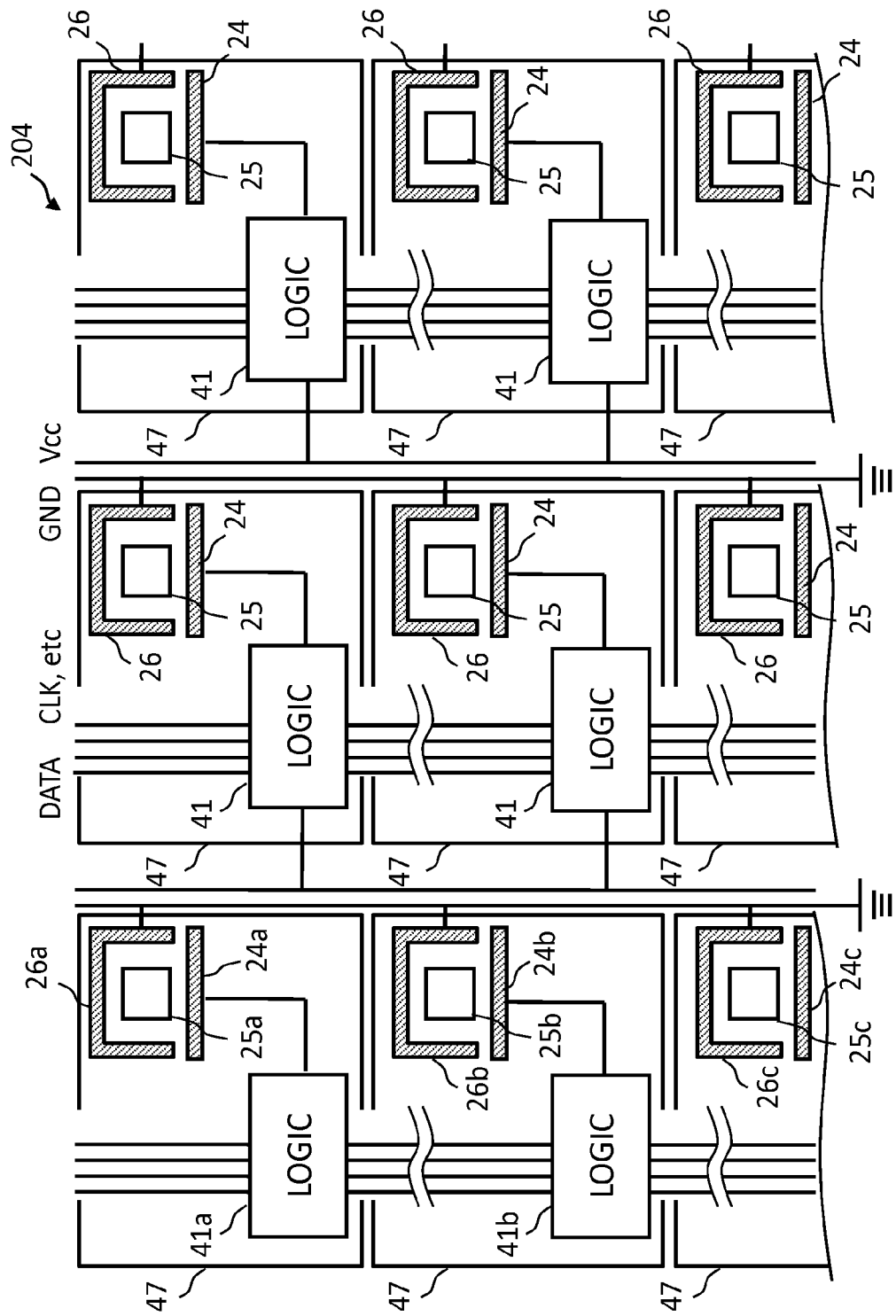
FIG. 4 is a top view conceptual diagram showing a portion of the structure in a membrane region of a blanking aperture array mechanism according to the first embodiment.

FIG. 4 is a top view conceptual diagram showing a portion of the structure in a membrane region of a blanking aperture array mechanism according to the first embodiment. The position relation of a control electrode 24, a counter electrode 26, a control circuit 41, and a pad 43 in FIG. 3 is not in accordance with that of FIG. 4. With regard to the structure of the blanking aperture array mechanism 204, a semiconductor substrate 31 made of silicon, etc. is placed on a support table 33 as shown in FIG. 3. The central part of the substrate 31 is shaved, for example, from the back side into a membrane region 330 (first region) having a thin film thickness h. The periphery surrounding the membrane region 330 is an outer peripheral region 332 (second region) having a thick film thickness H. The upper surface of the membrane region 330 and the upper surface of the outer peripheral region 332 are formed to be flush or substantially flush in height with each other. At the back side of the outer peripheral region 332, the substrate 31 is supported on the support table 33. The central part of the support table 33 is open, and the membrane region 330 is located at this opening region.

In the membrane region 330, passage holes 25 (openings) through each of which a corresponding one of the multiple beams 20 passes are formed at positions each corresponding to each hole 22 in the shaping aperture array substrate 203 shown in FIG. 2. In other words, in the membrane region 330 of the substrate 31, there are formed a plurality of passage holes 25, in an array state, through each of which a corresponding one of the multiple electron beams 20 passes. Moreover, in the membrane region 330 of the substrate 31, there are arranged a plurality of electrode pairs each composed of two electrodes being opposite to each other with respect to a corresponding one of a plurality of passage holes 25. Specifically, in the membrane region 330, as shown in FIGS. 3 and 4, each pair (blanker: blanking deflector) of the control electrode 24 and the counter electrode 26 for blanking deflection is arranged close to a corresponding passage hole 25 in a manner such that the electrodes 24 and 26 are opposite to each other across the passage hole 25 concerned. Moreover, close to each passage hole 25 in the membrane region 330, inside the substrate 31, there is arranged a control circuit 41 (logic circuit) which applies a deflection voltage to the control electrode 24 for the passage hole 25 concerned. The counter electrode 26 for each beam is grounded.

As shown in FIG. 4, to each control circuit 41, n-bit (e.g., 10-bit) parallel lines for control signals are connected. In addition to the n-bit parallel lines for controlling signals, lines for a clock signal, a read signal, a shot signal, a power supply, and the like are connected to each control circuit 41. Alternatively, a part of the parallel lines may be used as the lines for a clock signal, a read signal, a shot signal, a power supply, and the like. An individual blanking control mechanism 47 composed of the control electrode 24, the counter electrode 26, and the control circuit 41 is configured for each of the multiple beams. In the case of FIG. 3, the control electrode 24, the counter electrode 26, and the control circuit 41 are arranged in the membrane region 330 with a thin film thickness of the blanking aperture array substrate 31. However, it is not limited thereto. A plurality of control circuits 41 formed in an array in the membrane region 330 are grouped, for example, per row or per column, and the control circuits 41 in each group are connected in series as shown in FIG. 4. Then, the pad 43 arranged for each group sends a signal to the control circuits 41 in the group concerned. Specifically, a shift register (not shown) is arranged in each control circuit 41, and shift registers in the control circuits 41 for beams in the same row, for example, in pxq, for example, multiple beams are connected in series. For example, control signals for beams in the same row in the pxq multiple beams are transmitted in series, and, a control signal for each beam is stored in a corresponding control circuit 41 by p-times clock signals, for example.

Figure 5:
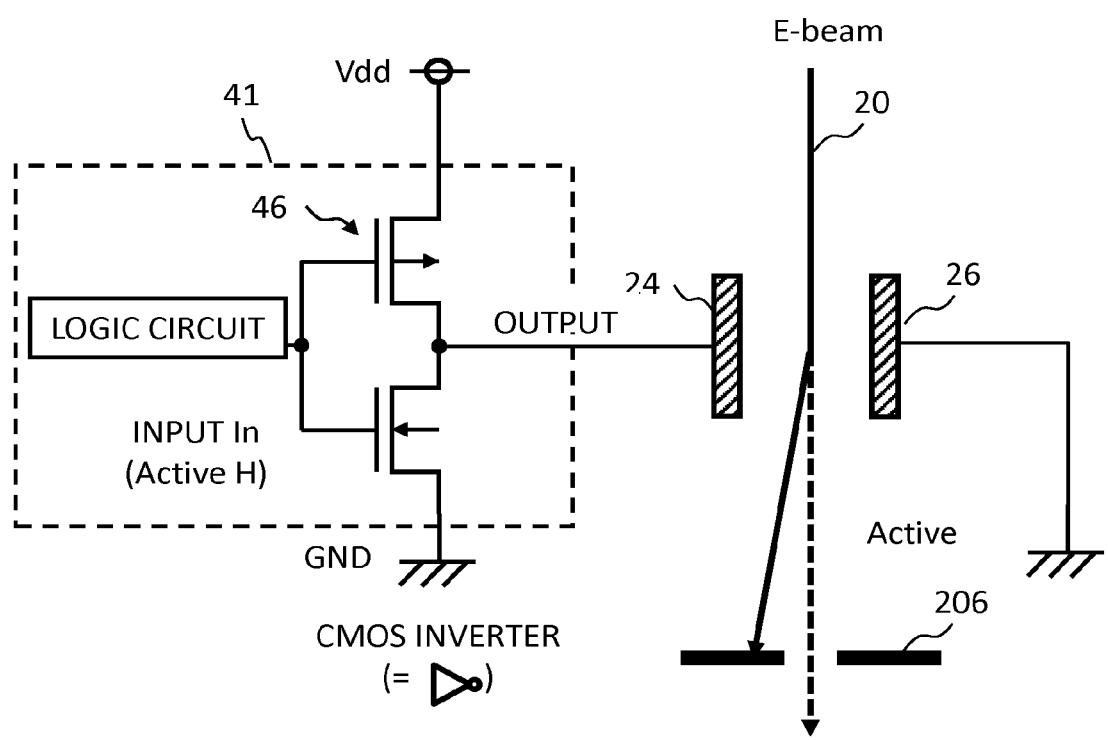
FIG. 5 is an illustration diagram of an example of an individual blanking mechanism according to the first embodiment.

FIG. 5 is an illustration diagram of an example of an individual blanking mechanism according to the first embodiment. As shown in FIG. 5, an amplifier 46 (an example of a switching circuit) is arranged in the control circuit 41. In the case of FIG. 5, a CMOS (complementary MOS) inverter circuit is arranged as an example of the amplifier 46. The CMOS inverter circuit is connected to a positive potential (Vdd: blanking potential: first potential) (e.g., 5 V) (first potential) and to a ground potential (CND: second potential). The output line (OUT) of the CMOS inverter circuit is connected to the control electrode 24. By contrast, the counter electrode 26 is applied with a ground potential. A plurality of control electrodes 24, each of which is applied with a blanking potential and a ground potential in a switchable manner, are arranged on the substrate 31 such that each control electrode 24 and the corresponding counter electrode 26 are opposite to each other across the passage hole 25 concerned in the plurality of passage holes 25.

As an input (IN) to each CMOS inverter circuit, either an L (low) potential (e.g., ground potential) lower than a threshold voltage, or an H (high) potential (e.g., 1.5 V) higher than or equal to the threshold voltage is applied as a control signal. According to the first embodiment, in a state where an L potential is applied to the input (IN) of the CMOS inverter circuit, the output (OUT) of the CMOS inverter circuit becomes a positive potential (Vdd), and then, a corresponding one of the multiple beams 20 is deflected by an electric field due to a potential difference from the ground potential of the counter electrode 26, and controlled to be in a beam OFF condition by being blocked by the limiting aperture substrate 206. In contrast, in a state (active state) where an H potential is applied to the input (IN) of the CMOS inverter circuit, the output (OUT) of the CMOS inverter circuit becomes a ground potential, and therefore, since there is no potential difference from the ground potential of the counter electrode 26, a corresponding one of the multiple beams 20 is not deflected, and is controlled to be in a beam ON condition by passing through the limiting aperture substrate 206.

A corresponding one of the multiple beams 20, passing through a corresponding passage hole, is deflected by a voltage independently applied to a pair of the control electrode 24 and the counter electrode 26. Blanking control is provided by this deflection. Specifically, a pair of the control electrode 24 and the counter electrode 26 individually provides blanking deflection of a corresponding beam of the multiple beams 20 by an electric potential switchable by the CMOS inverter circuit serving as a switching circuit corresponding to each pair. Thus, each of a plurality of blankers performs blanking deflection of a corresponding one of the multiple beams 20 having passed through a plurality of holes 22 (openings) in the shaping aperture array substrate 203.

Figure 6:
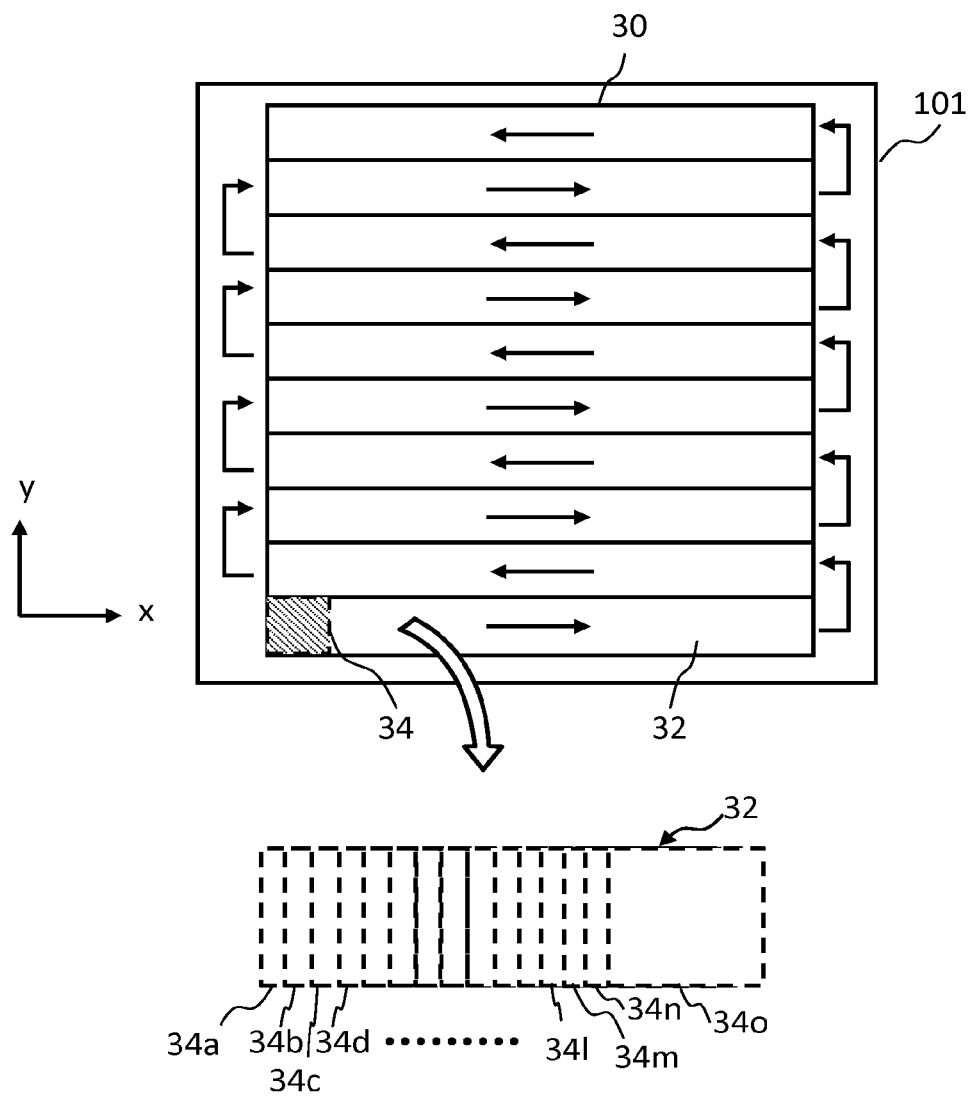
FIG. 6 is a conceptual diagram illustrating an example of a writing operation according to the first embodiment.

FIG. 6 is a conceptual diagram illustrating an example of a writing operation according to the first embodiment. As shown in FIG. 6, a writing region 30 of the target object 101 is virtually divided, for example, by a predetermined width in the y direction into a plurality of stripe regions 32 in a strip form. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of a plurality of holes 22 are formed at a time by one shot of multiple beams having been formed by passing through the holes 22 in the shaping aperture array substrate 203. Further, although FIG. 6 shows the case where writing is performed once for each stripe region 32, it is not limited thereto. It is also preferable to perform multiple writing which writes the same region multiple times. In performing the multiple writing, preferably, the stripe region 32 of each pass is set while shifting the position.

Figure 7:
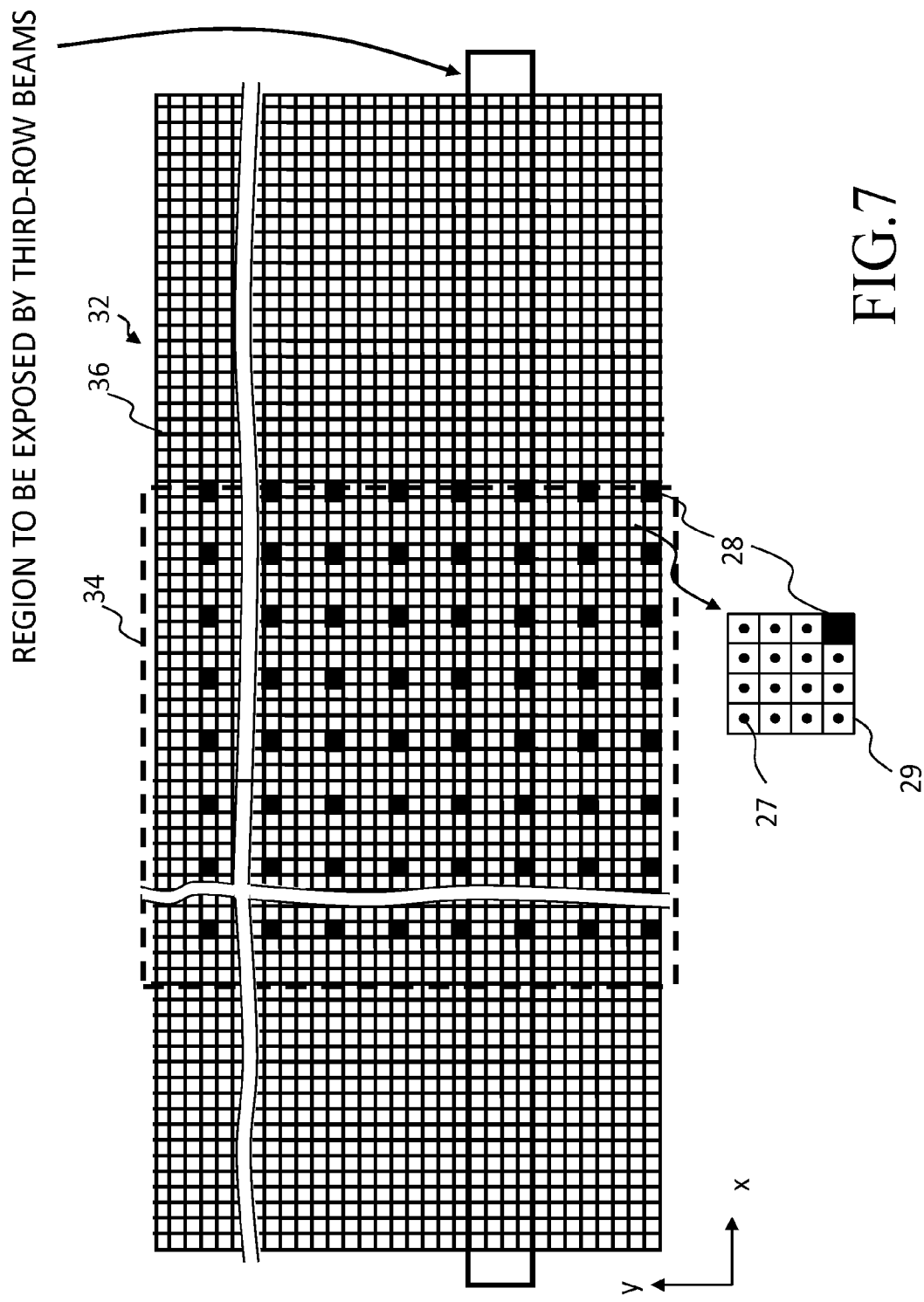
FIG. 7 is an illustration showing an example of an irradiation region of multiple beams and a writing target pixel according to the first embodiment.

FIG. 7 is an illustration showing an example of an irradiation region of multiple beams and a pixel to be written (writing target pixel) according to the first embodiment. In FIG. 7, in the stripe region 32, there are set a plurality of control grids 27 (design grids) arranged in a grid form at the beam size pitch of the multiple beams 20 on the surface of the target object 101, for example. Preferably, the control grids 27 are arranged at a pitch of around 10 nm. The plurality of control grids 27 serve as design irradiation positions of the multiple beams 20. The arrangement pitch of the control grid 27 is not limited to the beam size, and may be any size that can be controlled as a deflection position of the deflector 209 regardless of the beam size. Then, a plurality of pixels 36, each of which is centering on each control grid 27, are set by virtually dividing into a mesh form by the same size as that of the arrangement pitch of the control grid 27. Each pixel 36 serves as an irradiation unit region per beam of the multiple beams. FIG. 7 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The x-direction size of the irradiation region 34 can be defined by the value obtained by multiplying the beam pitch (pitch between beams) in the x direction of the multiple beams 20 by the number of beams in the x direction. The y-direction size of the irradiation region 34 can be defined by the value obtained by multiplying the beam pitch in the y direction of the multiple beams 20 by the number of beams in the y direction. The width of the stripe region 32 is not limited to this. Preferably, the width of the stripe region 32 is n times (n being an integer of one or more) the size of the irradiation region 34. FIG. 7 shows the case where the multiple beams of 512×512 (rows×columns) are simplified to 8×8 (rows×columns). In the irradiation region 34, there are shown a plurality of pixels 28 (beam writing positions) which can be irradiated with one shot of the multiple beams 20. In other words, the pitch between adjacent pixels 28 is the pitch between beams of the design multiple beams. In the example of FIG. 7, one sub-irradiation region 29 is a region surrounded by beam pitches. In the case of FIG. 7, each sub-irradiation region 29 is composed of 4×4 pixels.

Figure 8:
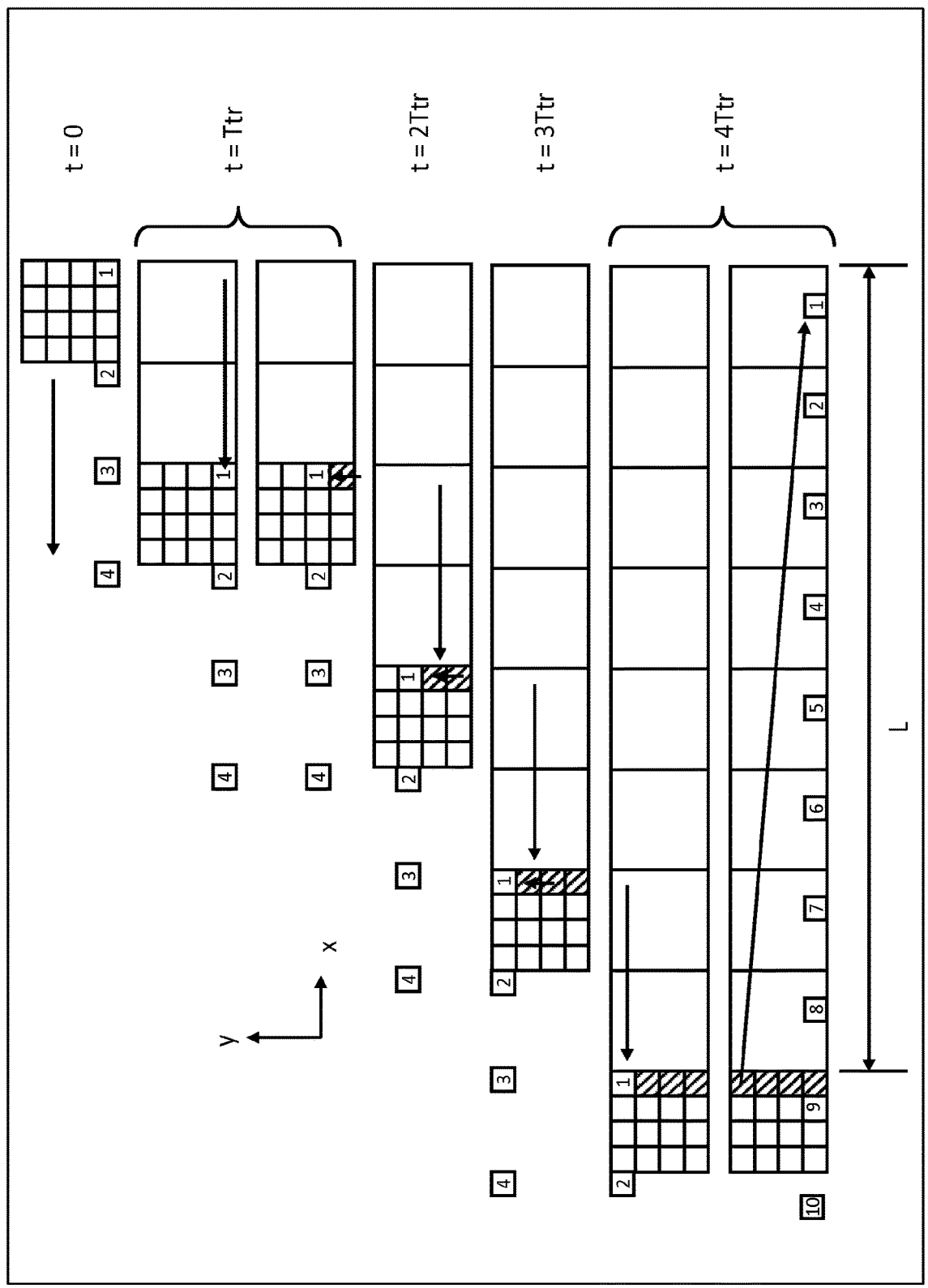
FIG. 8 is an illustration showing an example of a writing method of multiple beams according to the first embodiment.

FIG. 8 is an illustration showing an example of a writing method of multiple beams according to the first embodiment. FIG. 8 shows a portion of the sub-irradiation region 29 to be written by each of beams at the coordinates (1, 3), (2, 3), (3, 3), ..., (512, 3) in the y-direction third row from the bottom in the multiple beams for writing the stripe region 32 shown in FIG. 7. In the example of FIG. 8, while the XY stage 105 moves the distance of eight beam pitches, four pixels are written (exposed), for example. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple beams 20 by the deflector 208. In other words, tracking control is performed. In the case of FIG. 8, one tracking cycle is executed by writing (exposing) four pixels during a movement by the distance of eight beam pitches.

Specifically, the stage position detector 139 measures the position of the XY stage 105 by irradiating the mirror 210 with a laser and receiving a reflected light from the mirror 210. The measured position of the XY stage 105 is output to the control computer 110. In the control computer 110, the writing control unit 74 outputs the position information on the XY stage 105 to the deflection control circuit 130. In accordance with the movement of the XY stage 105, the deflection control circuit 130 calculates deflection amount data (tracking deflection data) for deflecting beams to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the deflector 208.

The writing mechanism 150 irradiates each control grid 27 with a corresponding beam in an ON state in the multiple beams 20 during a writing time (irradiation time or exposure time) corresponding to each control grid 27 within a maximum irradiation time Ttr of the irradiation time of each beam of the multiple beams of the shot concerned.

In the example of FIG. 8, during the time from t=0 to t=maximum irradiation time Ttr, the control grid 27 of the first pixel 36 from the right in the bottom row of the sub-irradiation region 29 concerned is irradiated with the first shot of the beam (1) at coordinates (1, 3), for example. Thereby, the pixel concerned has received beam irradiation for a desired irradiation time. The XY stage 105 moves two beam pitches in the −x direction during the time from t=0 to t=Ttr, for example. During this time period, the tracking operation is continuously performed.

After the maximum irradiation time Ttr of the shot concerned has passed since the start of beam irradiation with the shot concerned, while a beam deflection for tracking control is continuously performed by the deflector 208, the writing position (previous writing position) of each beam is shifted to a next writing position (current writing position) of each beam by collectively deflecting the multiple beams 20 by the deflector 209, which is performed in addition to the beam deflection for tracking control. In the example of FIG. 8, when the time becomes t=Ttr, the target control grid 27 to be written is shifted from the control grid 27 of the first pixel 36 from the right in the bottom row of the sub-irradiation region 29 concerned to the control grid 27 of the first pixel 36 from the right in the second row from the bottom. Since the XY stage 105 is moving at a fixed speed also during this time period, the tracking operation is continuously performed.

Then, while the tracking control is continuously performed, each corresponding one of ON beams in the multiple beams 20 is applied to the shifted writing position corresponding to the each beam during a writing time corresponding to each beam within the maximum writing time Ttr of the shot concerned. In the example of FIG. 8, during the time from t=Ttr to t=2 Ttr, the control grid 27 of the first pixel 36 from the right in the second row from the bottom of the sub-irradiation region 29 concerned is irradiated with the second shot of the beam (1) at the coordinates (1, 3), for example. The XY stage 105 moves two beam pitches in the −x direction during the time from t=Ttr to t=2 Ttr, for example. During this time period, the tracking operation is continuously performed.

In the example of FIG. 8, when the time becomes t=2 Ttr, the target control grid 27 to be written is shifted from the control grid 27 of the first pixel 36 from the right in the second row from the bottom of the sub-irradiation region 29 concerned to the control grid 27 of the first pixel 36 from the right in the third row from the bottom by collective deflection of the multiple beams by the deflector 209. Since the XY stage 105 is moving also during this time period, the tracking operation is continuously performed. Then, during the time from t=2 Ttr to t=3 Ttr, the control grid 27 of the first pixel 36 from the right in the third row from the bottom of the sub-irradiation region 29 concerned is irradiated with the third shot of the beam (1) at the coordinates (1, 3), for example. Thereby, the control grid 27 of the pixel 36 concerned has received beam irradiation for a desired irradiation time.

The XY stage 105 moves two beam pitches in the −x direction during the time from t=2 Ttr to t=3 Ttr, for example. During this time period, the tracking operation is continuously performed. When the time becomes t=3 Ttr, the target control grid 27 to be written is shifted from the control grid 27 of the first pixel 36 from the right in the third row from the bottom of the sub-irradiation region 29 concerned to the control grid 27 of the first pixel 36 from the right in the fourth row from the bottom by collectively deflecting the multiple beams by the deflector 209. Since the XY stage 105 is moving also during this time period, the tracking operation is continuously performed.

During the time from t=3 Ttr to t=4 Ttr, the control grid 27 of the first pixel 36 from the right in the fourth row from the bottom of the sub-irradiation region 29 concerned is irradiated with the fourth shot of the beam (1) at the coordinates (1, 3), for example. Thereby, the control grid 27 of the pixel 36 concerned has received beam irradiation for a desired irradiation time.

The XY stage 105 moves two beam pitches in the −x direction during the time from t=3 Ttr to t=4 Ttr, for example. During this time period, the tracking operation is continuously performed. Thus, in this manner, writing of the first pixels from the right in the sub-irradiation region 29 concerned has been completed.

In the example of FIG. 8, after applying a corresponding beam to the writing position of each beam which has been shifted three times from the initial position, the DAC amplifier unit 134 returns the tracking position to the start position of tracking where the tracking control was started, by resetting the beam deflection for tracking control. In other words, the tracking position is returned in the opposite direction to the direction of the stage movement. In the example of FIG. 8, when the time becomes t=4 Ttr, tracking of the sub-irradiation region 29 concerned is cancelled, and the beam is swung back to a new sub-irradiation region 29 shifted by eight beam pitches in the x direction. Although the beam (1) at the coordinates (1, 3) has been described in the example of FIG. 8, writing is also similarly performed for each sub-irradiation region 29 corresponding to a beam at other coordinates. That is, when the time becomes t=4 Ttr, the beam at coordinates (n, m) completes writing of the first pixels from the right in a corresponding sub-irradiation region 29. For example, the beam (2) at coordinates (2, 3) completes writing of the first pixels from the right in another sub-irradiation region 29 adjacent in the −x direction to the sub-irradiation region 29 for the beam (1) of FIG. 7.

Since writing of the first pixels from the right in each sub-irradiation region 29 has been completed, the deflector 209 performs, after resetting the tracking, in the next tracking cycle, deflection such that the writing position of each corresponding beam is adjusted (shifted) to the control grid 27 of the second pixel from the right in the bottom row of each sub-irradiation region 29.

As described above, in the state where the relative position of the irradiation region 34 to the target object 101 is controlled by the deflector 208 to be the same (unchanged) position during the same tracking cycle, each shot is performed while shifting per control grid 27 (pixel 36) by the deflector 209. Then, after finishing one tracking cycle and returning the tracking position of the irradiation region 34, as shown in the lower part of FIG. 6, the first shot position is adjusted to the position shifted by one control grid (one pixel), for example, and each shot is performed shifting per control grid (per pixel) by the deflector 209 while executing the next tracking control. By repeating this operation during writing the stripe region 32, the position of the irradiation region 34 is shifted one by one, such as from 34a to 34o, to perform writing of the stripe region concerned.

When writing the target object 101 with the multiple beams 20, as described above, irradiation is performed per control grid (one pixel) sequentially and continuously with multiple beams 20, serving as shot beams, by moving the beam deflection position by the deflector 209 while following the movement of the XY stage 105 during the tracking operation by the deflector 208. It is determined, based on the writing sequence, which beam of multiple beams irradiates which control grid 27 (pixel 36) on the target object 101. Then, the region obtained by multiplying the beam pitch (x direction) by the beam pitch (y direction), where the beam pitch is between beams adjacent in the x or y direction of multiple beams on the surface of the target object 101, is configured by a region (sub-irradiation region 29) composed of n×n pixels. For example, when the XY stage 105 moves in the −x direction by the distance of the beam pitch (x direction) by one tracking operation, as described above, n control grids (n pixels) are written in the y direction by one beam while the irradiation position is shifted. Alternatively, n control grids (n pixels) may be written in the x direction or diagonal direction by one beam while the irradiation position is shifted. Then, by the next tracking operation, other n pixels in the same n×n pixel region are similarly written by a different beam from the one used above. Thus, writing is performed for each n pixels by a different beam each time in n-time tracking operations, thereby writing all of the pixels in one region of n×n pixels. With respect also to other regions each composed of n×n pixels in the irradiation region of the multiple beams, the same operation is executed at the same time so as to perform writing similarly.

Next, operations of the writing mechanism 150 of the writing apparatus 100 will be described. The electron beam 200 emitted from the electron gun 201 (emission source) illuminates the whole of the shaping aperture array substrate 203 by the illumination lens 202. A plurality of rectangular (including square) holes 22 (openings) are formed in the shaping aperture array substrate 203. The region including all of the plurality of holes 22 is irradiated with the electron beam 200. For example, a plurality of rectangular (including square) electron beams (multiple beams 20) are formed by letting portions of the electron beam 200 applied to the positions of a plurality of holes 22 individually pass through a corresponding hole of the plurality of holes 22 of the shaping aperture array substrate 203. The multiple beams 20 individually pass through corresponding blankers (first deflector: individual blanking mechanism) of the blanking aperture array mechanism 204. Each blanker deflects (provides blanking deflection) the electron beam passing therethrough individually.

The multiple beams 20 having passed through the blanking aperture array mechanism 204 are reduced by the reducing lens 205, and travel toward the hole in the center of the limiting aperture substrate 206. Then, the electron beam in the multiple beams 20 which was deflected by the blanker of the blanking aperture array mechanism 204 deviates (shifts) from the hole in the center of the limiting aperture substrate 206 and is blocked by the limiting aperture substrate 206. In contrast, the electron beam which was not deflected by the blanker of the blanking aperture array mechanism 204 passes through the hole in the center of the limiting aperture substrate 206 as shown in FIG. 1. Blanking control is provided by ON/OFF of the individual blanking mechanism 47 so as to control ON/OFF of beams. Thus, the limiting aperture substrate 206 blocks each beam which was deflected to be in the OFF state by the individual blanking mechanism 47. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, respective beams having passed through the limiting aperture substrate 206 (the whole of the multiple beams 20 having passed) are collectively deflected in the same direction by the deflectors 208 and 209 in order to irradiate respective beam irradiation positions on the target object 101. Ideally, the multiple beams 20 irradiating at a time are aligned at pitches obtained by multiplying the arrangement pitch of a plurality of holes 22 of the shaping aperture array substrate 203 by a desired reduction ratio described above.

Figure 9:
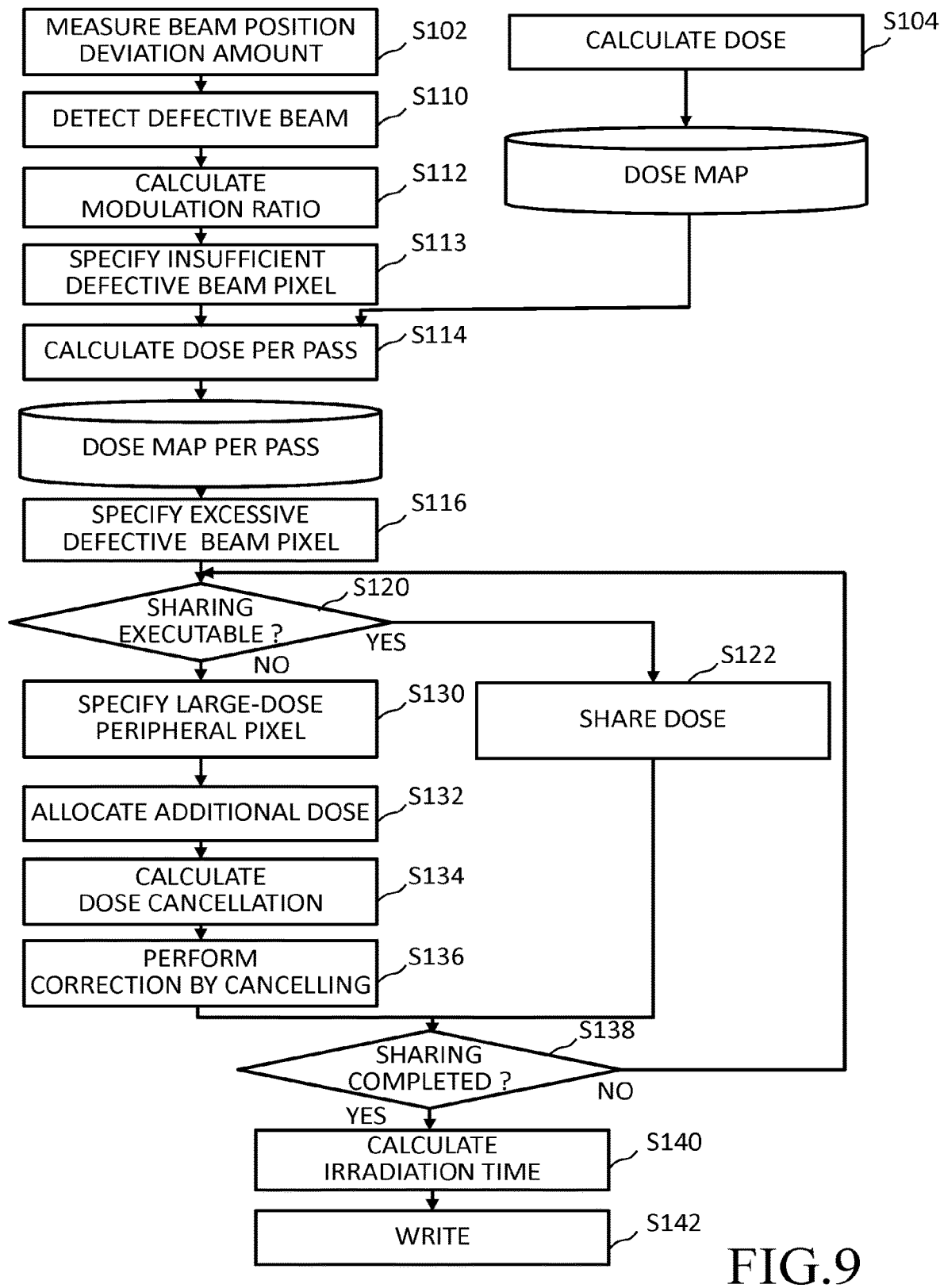
FIG. 9 is a flowchart showing main steps of a writing method according to the first embodiment.

FIG. 9 is a flowchart showing main steps of a writing method according to the first embodiment. In FIG. 9, the writing method of the first embodiment executes a series of steps: a beam-position deviation-amount measurement step (S102), a dose calculation step (S104), a defective beam detection step (S110), a modulation ratio (or factor) calculation step (S112), an insufficient defective beam pixel specifying step (S113), a dose-per-pass calculation step (S114), an excessive dose defective beam pixel specifying step (S116), a determination step (S120), a dose sharing step (S122), a large-dose peripheral-pixel specifying step (S130), an additional dose allocation step (S132), a dose cancelation calculation step (S134), a cancellation correction step (S136), a determination step (S138), an irradiation time calculation step (S140), and a writing step (S142).

In the beam-position deviation-amount measurement step (S102), the writing apparatus 100 measures a position deviation amount of an irradiation position of each beam of the multiple beams 20 deviating from a corresponding control grid 27 on the target object 101.

FIGS. 10A and 10B are illustrations showing a beam position deviation and a position deviation periodicity according to the first embodiment. In the multiple beams 20, as shown in FIG. 10A, distortion occurs in an exposure field due to optical system characteristics, and therefore, an actual irradiation position 39 of each beam is deviated from an irradiation position 37 of the ideal grid because of the distortion and the like. Then, according to the first embodiment, the amount of a position deviation of the actual irradiation position 39 of each beam is measured. Specifically, an evaluation substrate coated with resist is irradiated with the multiple beams 20, and the irradiated evaluation substrate is developed in order to generate a resist pattern. Then, the position of the generated resist pattern is measured by a position measuring instrument so as to measure a position deviation amount of each beam. If it is difficult to measure the size of the resist pattern at the irradiation position of each beam by a position measuring instrument since the shot size of the beam concerned is small, it should write, with each beam, a figure pattern (e.g., rectangular pattern) of a measurable size by a position measuring instrument, measure edge positions of the both sides of the figure pattern (resist pattern), and measure a position deviation amount of a target beam based on a difference between the intermediate position of the both edges and the intermediate position of a figure pattern in design. Then, obtained position deviation amount data on each beam irradiation position is input into the writing apparatus 100, and stored in the storage device 144. Further, in the multiple beam writing, in the case of the writing sequence explained in FIG. 8, for example, since writing proceeds while shifting the irradiation region 34 in the stripe region 32, periodicity is generated in position deviation of each beam every time the irradiation region 34 is moved because the position of the irradiation region 34 moves one by one, such as from the irradiation region 34a to 34o, during writing of the stripe region 32 as shown in the lower part of FIG. 6. Alternatively, in the case of the writing sequence where each beam irradiates all of the pixels 36 in the sub-irradiation region 29 corresponding to the beam concerned, as shown in FIG. 10B, periodicity is generated at least in the position deviation of each beam in each unit region 35 (35a, 35b, . . . ) having the same size as the irradiation region 34. Therefore, if the position deviation amount of each beam for one irradiation region 34 is measured, the measurement result can also be used for other regions. In other words, it is sufficient to measure a position deviation amount at each pixel 36 in the sub irradiation region 29 corresponding to each beam.

The beam-position deviation map generation unit 54 generates a beam-position deviation amount map (1) which defines a position deviation amount of each beam per beam array, that is, each beam in the irradiation region 34. Specifically, the beam-position deviation map generation unit 54 reads position deviation amount data on the irradiation position of each beam from the storage device 144, and generates the beam-position deviation amount map (1) by using the data as a map value.

Next, the beam-position deviation map generation unit 54 generates a beam-position deviation amount map (2) for the control grid 27 of each pixel 36 in the stripe region 32. Which beam irradiates the control grid 27 of each pixel 36 in the stripe region 32 is determined based on the writing sequence as described with reference to FIG. 8, for example. Therefore, for each control grid 27 of each pixel 36 in the stripe region 32, the beam-position deviation map generation unit 54 specifies a beam to irradiate the control grid 27 concerned according to the writing sequence, and calculates a position deviation amount of the beam concerned. The beam-position deviation map generation unit 54 generates the beam-position deviation amount map (2) for each stripe by using the amount of a position deviation of the irradiation position of a beam to each control grid 27, as a map value. As described above, since periodicity is generated in the position deviation of each beam, the beam-position deviation amount map (2) for each stripe can be generated by using a value of the beam-position deviation amount map (1) for each beam array. The generated beam-position deviation amount map (2) is stored in the storage device 144.

In the dose calculation step (S104), first, the rasterization unit 50 reads writing data from the storage device 140, and calculates, for each pixel 36, a pattern area density $\rho'$ in the pixel 36 concerned. This processing is performed for each stripe region 32, for example.

Next, the dose map generation unit 52 virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 μm. The dose map generation unit 52 reads writing data from the storage device 140, and calculates, for each proximity mesh region, a pattern area density $\rho$ of a pattern arranged in the proximity mesh region concerned.

Next, the dose map generation unit 52 calculates, for each proximity mesh region, a proximity effect correction irradiation coefficient $D_p(x)$ (correction dose) for correcting a proximity effect. An unknown proximity effect correction irradiation coefficient $D_p(x)$ can be defined by a threshold model, which is similar to a conventional method, for correcting a proximity effect correction, by using a backscatter coefficient $\eta$, a dose threshold $D_{th}$ of the threshold model, a pattern area density $\rho$, and a distribution function $g(x)$.

Next, each dose map generation unit 52 calculates, for each pixel 36, an incident dose $D(x)$ (amount of dose) with which the pixel 36 concerned is irradiated. The incident dose $D(x)$ can be calculated, for example, by multiplying a pre-set base dose $D_{base}$, a proximity effect correction irradiation coefficient $D_p$, and a pattern area density $\rho'$. The base dose $D_{base}$ can be defined by $D_{th}/(1/2+\eta)$, for example. Thereby, it is possible to obtain an originally desired incident dose $D(x)$, for which the proximity effect has been corrected, based on layout of a plurality of figure patterns defined by the writing data.

Each dose map generation unit 52 generates a dose map defining an incident dose $D(x)$ for each pixel 36 per stripe unit. Such incident dose $D(x)$ for each pixel 36 serves as a designed incident dose $D(x)$ with which the control grid 27 of the pixel 36 concerned is to be irradiated. In other words, the dose map generation unit 52 generates a dose map defining an incident dose D(x) for each control grid 27 per stripe unit. The generated dose map is stored in the storage device 142, for example.

In the defective beam detection step (S110), the detection unit 56 detects a defective beam in the multiple beams 20. As the defective beam, exemplified are an excessive dose defective beam which delivers an excessive dose irradiation since controlling the beam dose is disabled, and an insufficient dose defective beam which delivers an insufficient dose irradiation since controlling the beam dose is disabled. Excessive dose defective beams include ON defective beams which are "always ON", and/or include a portion of uncontrollable defective beams whose irradiation time is uncontrollable. Insufficient dose defective beams include OFF defective beams which are "always OFF", and/or include the remaining of the uncontrollable defective beams. The ON defective beam being "always ON" performs all the time an irradiation of the maximum irradiation time Ttr, which is maximum in one shot, regardless of the control dose. Alternatively, furthermore, it continues the irradiation also during moving from one pixel to another. The OFF defective beam being an "always OFF" is all the time "OFF" regardless of the control dose. Specifically, under the control of the writing control unit 74, the writing mechanism 150 individually controls each of the multiple beams 20 to be "ON" one by one by the individual blanking mechanism 47, and the other beams, except for the "ON" beams, to be "OFF". In this state, if there is a beam whose current is not detected by the Faraday cup 106, it is detected as an OFF defective beam. Then, the control is switched from this state to a state in which a target beam to be detected is an "OFF" beam. In that case, if there is a beam whose current is detected by the Faraday cup 106 all the time, in spite of having been switched from an "ON" beam to an "OFF" beam to be detected, it is detected as an ON defective beam. If there is a beam whose current is detected by the Faraday cup 106 during a predetermined period, after having been switched from an "ON" beam to an "OFF" beam to be detected, it is detected as an uncontrollable defective beam. By checking each of the multiple beams 20 in order by the same method, it is possible to detect whether there is a defective beam or not, and where a defective beam is located.

The dose amount d' of an ON defective beam being "always ON" can be defined by the following equation (1) using a shot cycle Tsc (time) and a current density J. The shot cycle Tsc can be defined by a maximum irradiation time Ttr per shot of the multiple beams 20. It is also preferable that the maximum irradiation time Ttr per shot includes a switching time needed for switching a pixel to be beam-irradiated to another, a settling time for beam deflection, and a data transmission time.

$$d' = j \cdot Tsc \quad (1)$$

The dose of an uncontrollable defective beam which is "beam ON" only during a predetermined period can be obtained using a time period of the "beam ON" instead of the shot cycle Tsc of the equation (1).

In the modulation ratio calculation step (S112), each modulation ratio calculation unit 59 calculates, for each pixel 36, a dose modulation ratio (or factor) (first dose modulation ratio) of a beam to the pixel 36 concerned for correcting an irradiation pattern position deviation resulting from a position deviation of a beam delivered to the pixel 36 concerned in accordance with a writing sequence, and a dose modulation ratio (or factor) (second dose modulation ratio) for distributing/sharing a dose to at least one peripheral pixel surrounding the pixel concerned.

FIGS. 11A and 11B are illustrations showing an example of a method for correcting a position deviation according to the first embodiment. FIG. 11A shows the case where a beam "a'" irradiating the pixel at coordinates (x, y) causes a positional deviation in the −x and −y directions. In order to correct the deviated position of the pattern formed by the beam "a'" with such position deviation to be corrected to the position corresponding to the pixel at coordinates (x, y) as shown in FIG. 11B, correction can be accomplished by distributing (for sharing) the dose corresponding to the deviated position to a pixel located opposite to the direction of deviated peripheral pixels. In the example of FIG. 11A, the dose amount corresponding to the position deviated to the pixel at coordinates (x, y−1) should be distributed to the pixel at coordinates (x, y+1). The dose amount corresponding to the position deviated to the pixel at coordinates (x−1, y) should be distributed to the pixel at coordinates (x+1, y). The dose amount corresponding to the position deviated to the pixel at coordinates (x−1, y−1) should be distributed to the pixel at coordinates (x+1, y+1).

According to the first embodiment, a dose modulation ratio (or factor) (second dose modulation ratio), as a distribution amount, is calculated which is a dose to be distributed to a beam for at least one of peripheral pixels in proportion to a beam position deviation amount. The modulation ratio calculation unit 59 calculates a modulation ratio of a beam to the pixel concerned, and a modulation ratio of a beam to at least one of peripheral pixels surrounding the pixel concerned, in proportion to the ratio of the area deviated due to the positional deviation of the beam to the pixel concerned. Specifically, for each of peripheral pixels where a portion of a beam is overlapped because the beam has deviated from the pixel concerned, the ratio is calculated by dividing the deviated area (area of beam overlapping portion) by the beam area. This ratio is calculated as a distribution amount (dose modulation ratio) distributed to a pixel located opposite, with respect to the pixel concerned, to the pixel where the beam is overlapped.

In the case of FIG. 11A, the area ratio of the portion deviated to the pixel at coordinates (x, y−1) can be calculated by ("x direction beam size"−"−x direction deviation amount")×"y direction deviation amount"/("x direction beam size"×"y direction beam size"). Therefore, a distribution amount (dose modulation ratio) V to be distributed for correction to the pixel at coordinates (x, y+1) can be calculated by ("x direction beam size"−"−x direction deviation amount")×"y direction deviation amount"/("x direction beam size"×"y direction beam size").

Also, in the case of FIG. 11A, the area ratio of the portion deviated to the pixel at coordinates (x−1, y−1) can be calculated by "−x direction deviation amount"×"−y direction deviation amount"/("x direction beam size"×"y direction beam size"). Therefore, a distribution amount (beam modulation ratio) W to be distributed for correction to the pixel at coordinates (x+1, y+1) can be calculated by "−x direction deviation amount"×"−y direction deviation amount"/("x direction beam size"×"y direction beam size").

Also, in the case of FIG. 11A, the area ratio of the portion deviated to the pixel at coordinates (x−1, y) can be calculated by "−x direction deviation amount"×("y direction beam size"−"−y direction deviation amount")/("x direction beam size"×"y direction beam size"). Therefore, a distribution amount (beam modulation ratio) Z to be distributed for correction to the pixel at coordinates (x+1, y) can be calculated by "−x direction deviation amount"×("y direction beam size"−"−y direction deviation amount)"/("x direction beam size"×"y direction beam size").

Consequently, a modulation ratio U of the beam irradiating the pixel at coordinates (x, y), which remains without being distributed, can be calculated by 1−V−W−Z.

In this way, for each pixel, the modulation ratio of the beam to the pixel concerned, and the modulation ratio of the beam to at least one peripheral pixel serving as a distribution destination are calculated.

In the insufficient defective beam pixel specifying step (S113), the specifying unit 68 specifies, in defective beams, a pixel irradiated with an insufficient dose defective beam.

In the dose-per-pass calculation step (S114), the dose map generation unit 60 (dose calculation unit) reads a dose map from the storage device 142, and calculates, for each pixel, a dose per pass in multiple writing. In the case of FIG. 8, it moves thirty-two beam pitches (=four times×eight beam pitches) in the x direction by four tracking operations. Thus, during the moving of thirty-two beam pitches, one writing processing is performed/completed. With this configuration, if the multiple beams 20 is composed of, for example, 512×512 beams, multiple writing (multiplicity=16) by writing processing (pass) of sixteen times (=512/32) is performed for each pixel by one continuous movement of the XY stage 105 for writing from one end to the other end of each stripe region 32. In that case, arrangement position of each beam irradiating each pixel is different from each other for e ach pass. If the multiple beams 20 is composed of, for example, 32×32 beams, one writing processing (pass) is performed for each pixel by one continuous movement of the XY stage 105 for writing from one end to the other end of each stripe region 32. Therefore, if the XY stage 105 performs continuous movement by repeating, for example, four times for each stripe region 32, multiple writing (multiplicity=4) by writing processing (pass) of four times is performed for each pixel. In that case, as long as the irradiation position of each beam is not intentionally shifted, the position of the beam irradiating each pixel is the same for each pass. Which beam is used to irradiate each pixel in each pass is determined based on the writing sequence. According to the first embodiment, not the number of times of movement of the stage but each writing processing of multiple writing is expressed as one pass.

Figure 12A:
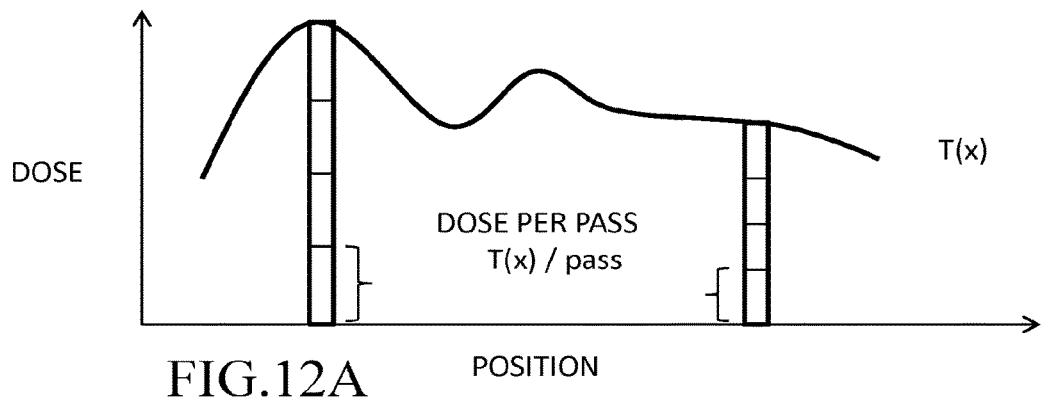
FIGS. 12A to 12C are diagrams of examples of a dose per pass in multiple writing using beams without deviation according to the first embodiment.
Figure 12B:
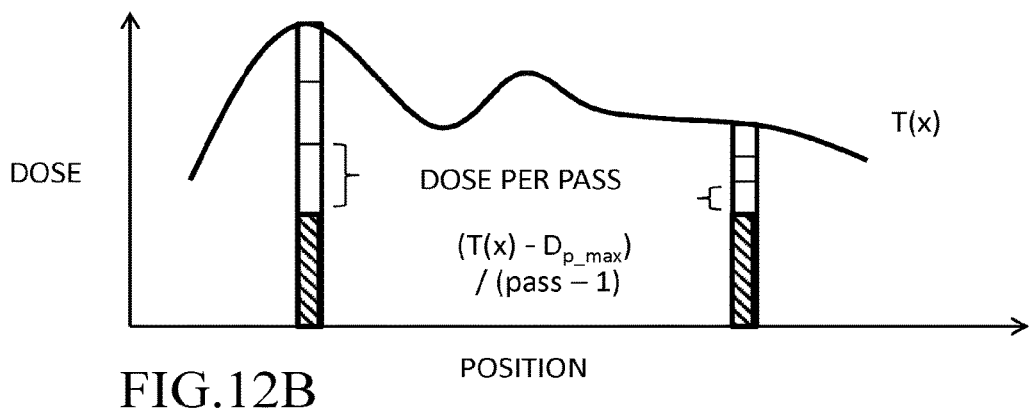
Figure 12C:
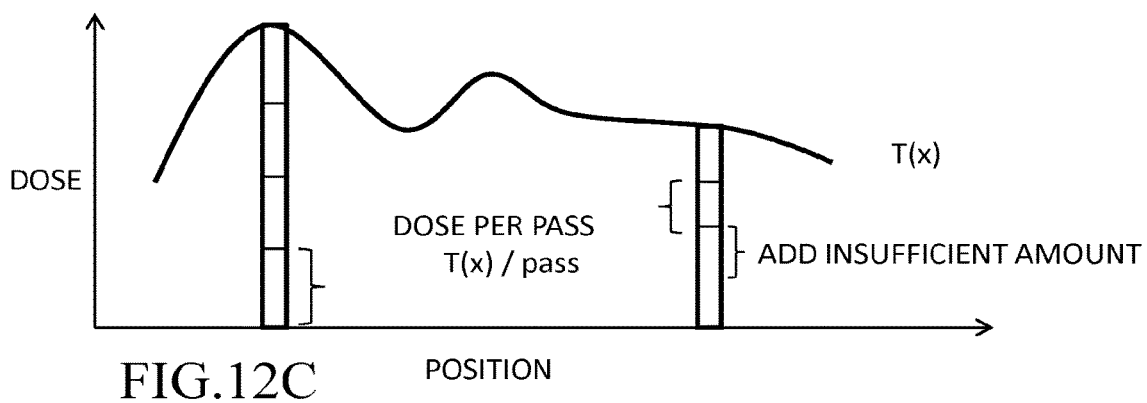

FIGS. 12A to 12C are diagrams of examples of a dose per pass in multiple writing using beams without deviation according to the first embodiment. If, as shown in FIG. 12A, for example, no defective beam is included in beams used for each pass, the dose per pass in multiple writing of each pixel can be defined by a value obtained by dividing a total dose T(x) which is a total of doses individually applied to a pixel by the number of times of multiple writing (the number of passes). If, for example, as shown in FIG. 12B, a beam for one pass is an ON defective beam, the dose of the pass using the ON defective beam is $D_{pmax}$, and the dose of each of the other passes can be defined by a value obtained by dividing the dose difference of subtracting the dose $D_{pmax}$ due to the ON defective beam from the total dose T(x), being a total of doses individually applied to a pixel, by the number of times of multiple writing from which once has been reduced (the number of passes from which one has been reduced). Further, the dose map generation unit 60 adds an insufficient dose amount at a pixel (position) irradiated with an insufficient dose defective beam in the multiple beams 20, to a dose amount to be applied (used) in a different pass from a pass (writing processing) using the insufficient dose amount in the multiple writing. For example, if one pass beam is an OFF defective beam, the dose amount of the pass using the OFF defective beam is zero. Therefore, as shown in FIG. 12C, for example, the dose equivalent to the insufficient dose is added to at least one of the other passes excluding the pass using the OFF defective beam. As long as there is no positional deviation in each beam, the calculation described above is sufficiently used. However, positional deviation may occur in each of the multiple beams as described above.

Then, the dose map generation unit 60 distributes, for each pass and for each pixel 36, a distribution dose amount obtained by multiplying the dose D of the pixel 36 concerned by a calculated dose modulation ratio (second dose modulation ratio) to a peripheral pixel being a distribution destination. Thereby, it becomes possible to obtain a dose for which position deviation/shape deviation of a pattern resulting from a positional deviation of a beam irradiation position has been corrected. A dose map (3) for each pass is generated using the dose of each pixel 36 (control grid 27) whose positional deviation of the irradiation position has been corrected.

In the excessive dose defective beam pixel specifying step (S116), the specifying unit 68 specifies a pixel irradiated with an excessive dose defective beam.

In the determination step (S120), the determination unit 62 determines, for each pixel irradiated with an excessive dose defective beam, whether it is possible to make the peripheral beams of an excessive dose defective beam share an excessive dose in order to offset (cancel out) the excessive dose due to the excessive dose defective beam. If the sharing is executable, it proceeds to the dose sharing step (S122). If the sharing is not executable, it proceeds to the large-dose peripheral-pixel specifying step (S130).

Figure 13:
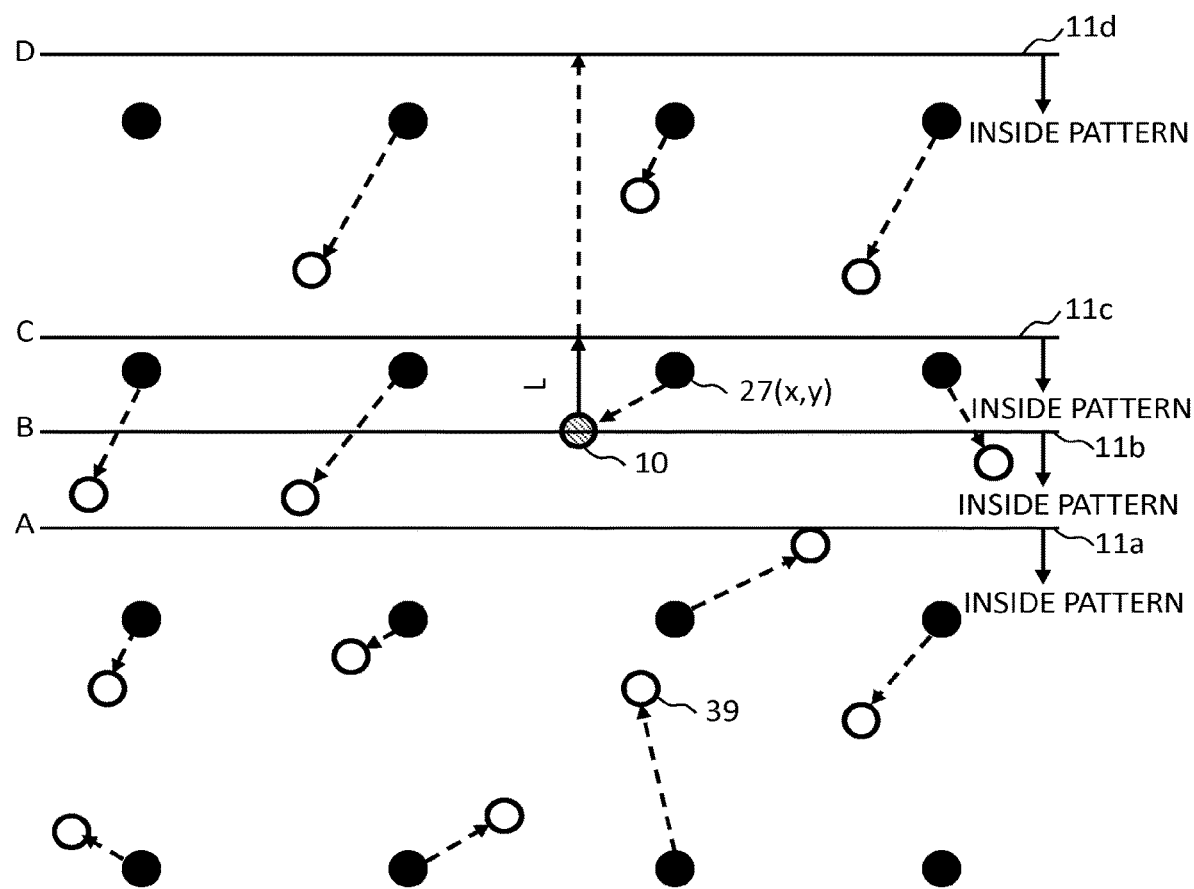
FIG. 13 is an illustration of an example of a relation among a control grid, a beam irradiation position, and a pattern edge according to the first embodiment.

FIG. 13 is an illustration of an example of a relation among a control grid, a beam irradiation position, and a pattern edge according to the first embodiment. Each of the multiple beams 20 ideally irradiates a corresponding control grid 27. However, as shown in FIG. 13, the actual irradiation position 39 is deviated from the control grid 27 in many cases. If there is an excessive dose defective beam 10 in these beams, the positional relationship with a writing target pattern causes a problem. As an assumed case, there is a case A in which the irradiation position of the excessive dose defective beam 10 is located outer than a pattern edge 11a, that is, outside the pattern. In addition, there is a case B in which the irradiation position of the excessive dose defective beam 10 is located on a pattern edge 11b. Further, there is a case C in which the irradiation position of the excessive dose defective beam 10 is located inside the pattern and in the vicinity of a pattern edge 11c inside the pattern. Further, there is a case D in which the irradiation position of the excessive dose defective beam 10 is located inside the pattern and sufficiently far from a pattern edge 11d.

The determination unit 62 determines whether it is possible to make peripheral beams of an excessive dose defective beam share the excessive dose (that is, reduce the distributed dose amount) in order to cancel out (offset) the excessive dose due to the excessive dose defective beam 10. Beams of other passes may be included in the peripheral beams. Since irradiation of a minus dose cannot be performed, the dose of each of the peripheral beams needs to be a positive finite value excluding zero in order to execute the sharing. Therefore, in the case A where the irradiation position of the excessive dose defective beam is located outside the pattern, since the peripheral beams are also located outside the pattern, their doses are originally zero, thereby not performing the sharing. In contrast, in the cases B, C and D, since peripheral beams can be inside the pattern, it is possible to perform sharing in principle. However, even in the cases B and C, it may be difficult to make peripheral beams of an excessive dose defective beam share the excessive dose, depending on the positional relation among the position of an excessive dose defective beam, the deviated positions of peripheral beams, and the pattern edge. Therefore, the determination unit 62 may determine that an excessive dose should be shared in the case A, and may also determine that an excessive dose should be shared in the cases A, B, and C. Which to select is previously set.

In the dose sharing step (S122), the dose distribution processing unit 61 performs distribution processing so that peripheral beams of an excessive dose defective beam may share the excessive dose due to the excessive dose defective beam in order to cancel out (offset) the excessive dose. First, an excessive dose can be obtained by deducting a dose D with which the pixel 36 concerned should be irradiated from the dose amount of an excessive dose defective beam. An excessive dose Δ can be defined by the following equation (2).

$$\Delta = d' - D \quad (2)$$

Figure 14:
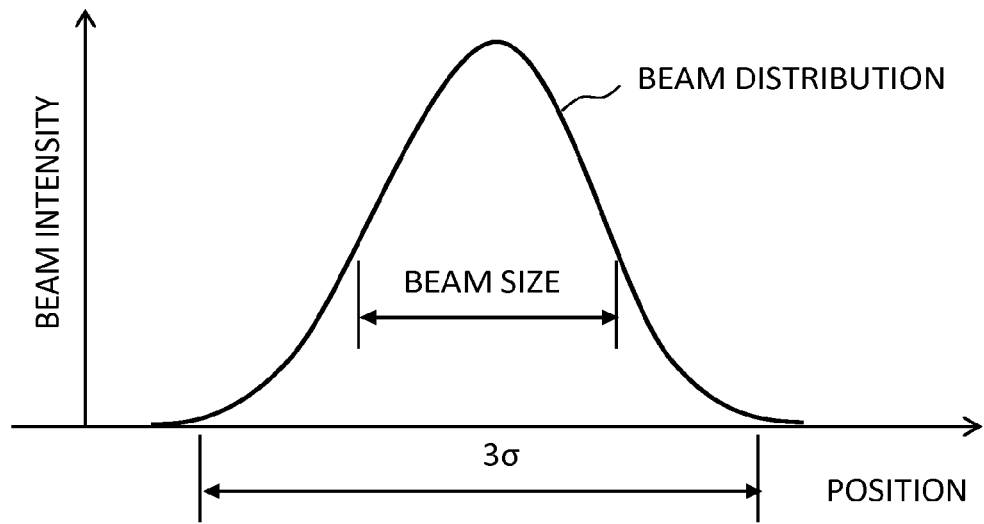
FIG. 14 is a graph for explaining a beam distribution according to the first embodiment.

FIG. 14 is a graph for explaining a beam distribution according to the first embodiment. In FIG. 14, the ordinate axis represents a beam intensity, and the abscissa axis represents a position. The intensity of each beam of the multiple beams is ideally a rectangular distribution having a width obtained by multiplying the width of the shaping aperture by a reduction ratio. However, actually, since blurring occurs due to aberration of the optical system, it becomes a distribution close to a Gaussian distribution, for example. Also, in that case, the width obtained by multiplying the width of the shaping aperture by a reduction ratio is defined as the beam size. Therefore, an actual beam has a blurring portion with a weak intensity around that beam size. The excessive dose due to this blurring portion also greatly affects the shape of a pattern edge. Then, according to the first embodiment, the distance L, from the irradiation position (gravity center of the excessive dose defective beam 10) of the excessive dose defective beam 10 to the pattern edge 11c, being within 3σ of the beam distribution where the influence of the blurring portion may be high, is defined as the vicinity of the pattern edge 11c of the case C. The case D, in which the irradiation position of the excessive dose defective beam 10 is located at the pattern center portion where the distance L from the irradiation position (gravity center of the excessive dose defective beam 10) of the excessive dose defective beam 10 to the pattern edge 11d is larger than 3σ of the beam distribution, is affected by the excessive dose. However, correction with accuracy lower than that of the cases B and C is sufficient for the case D. Therefore, it is preferable to distinguish the subsequent processing of the cases B and C from that of the case D.

Figure 15:
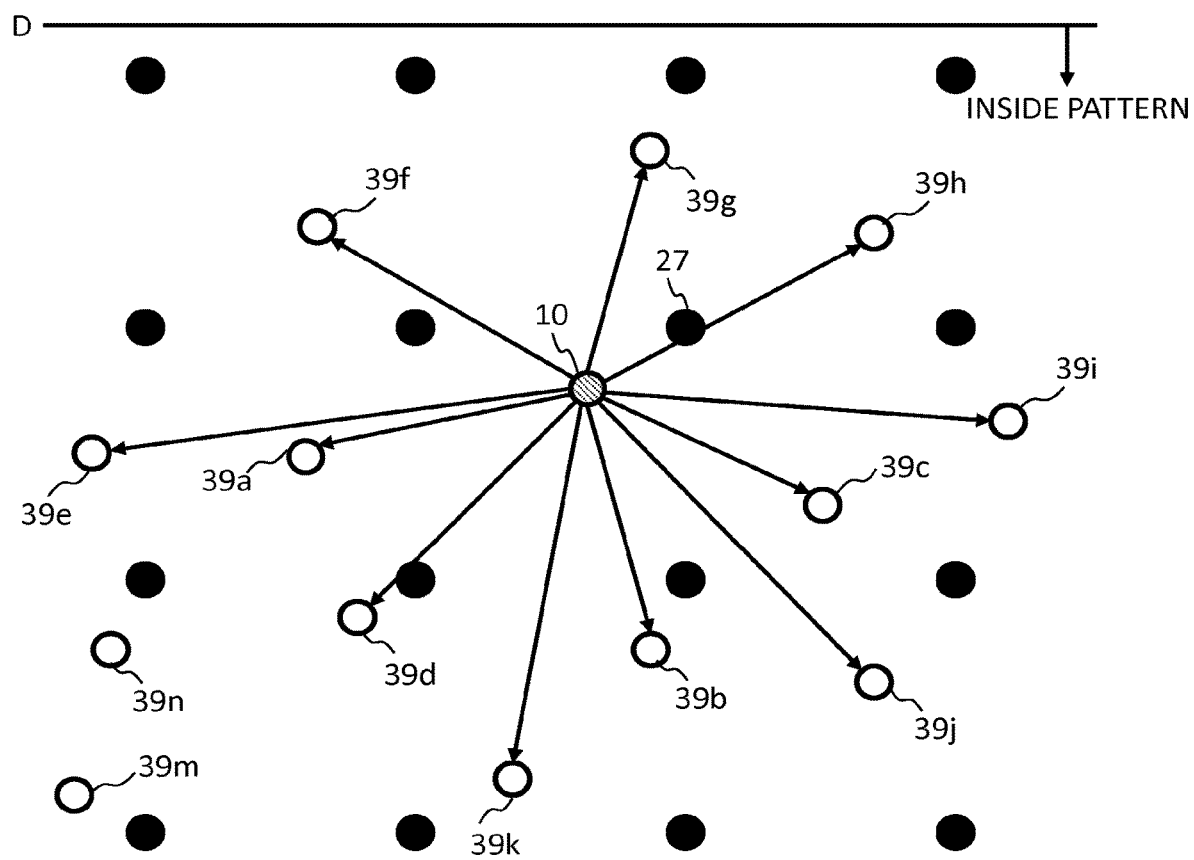
FIG. 15 is an illustration showing an example of peripheral beams of a defective beam at a pattern center according to the first embodiment.

FIG. 15 is an illustration showing an example of peripheral beams of a defective beam at a pattern center according to the first embodiment. In the case D, eleven (N=11) beams to the irradiation positions 39a to 39k within two beam pitches being twice the beam pitch between beams are used as the peripheral beams, for example. The inter-beam pitch used here may be a design size. In the case D, in which the irradiation position of the excessive dose defective beam 10 is located at the pattern center portion where the distance L from the irradiation position (the center of the gravity of the excessive dose defective beam 10) of the excessive dose defective beam 10 to the pattern edge 11d is larger than 3σ of the beam distribution, since the excessive dose has a small influence on the pattern edge shape, it is not necessary to increase the accuracy so much, and therefore, in order to shorten the calculation processing time, the gravity center position of whole the distributed doses is not considered. In the case D, the dose distribution processing unit 61 obtains each distributed dose amount ad by dividing an excessive dose Δ by the number (N) of specified peripheral beams. Each distributed dose amount ad can be defined by the following equation (3).

$$\delta d = \Delta / N \quad (3)$$

Even in the case D, in order to improve the correction accuracy, the distributed dose amount may be variable depending on a distance $r_i$ from the irradiation position of the excessive dose defective beam 10 to the irradiation position of a peripheral beam. i indicates the index of a target peripheral beam in the N peripheral beams. In that case, each distributed dose amount δdi can be defined by the following equation (4) using an excessive dose Δ and the distance $r_i$.

$$\delta d_i = \Delta \cdot \frac{1}{r_i} / \sum \frac{1}{r_i} \quad (4)$$

Then, the dose distribution processing unit 61 reduces a corresponding distributed dose amount δdi from the dose D of each of a plurality of peripheral beams.

In contrast, in the case B in which the irradiation position of the excessive dose defective beam 10 is located on the pattern edge 11b, and in the case C in which the irradiation position of the excessive dose defective beam 10 is located inside a pattern and in the vicinity of pattern edge 11c, since the shape of the pattern edge changes depending on a method for sharing the excessive dose, the gravity center position of whole the distributed doses needs to be considered in order to increase the correction accuracy.

Figure 16:
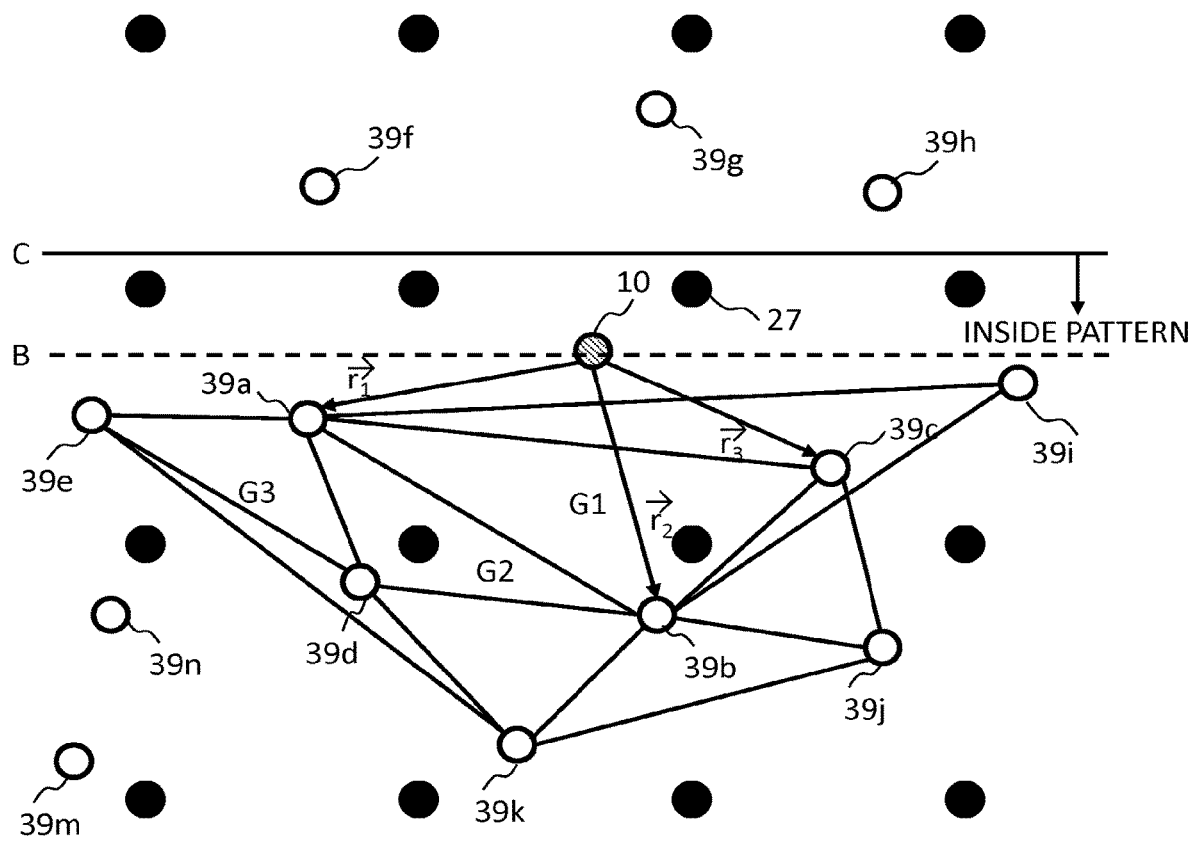
FIG. 16 is an illustration showing an example of peripheral beams of a defective beam on a pattern edge or in the vicinity of the edge according to the first embodiment.

FIG. 16 is an illustration showing an example of peripheral beams of a defective beam on a pattern edge or in the vicinity of the edge according to the first embodiment. Beams inside the pattern where the irradiation position 39 is located, for example, within the two beam pitches being twice the beam pitch between beams from the irradiation position of the excessive dose defective beam 10 are used as peripheral beams. The inter-beam pitch used here may be a design size. The range of peripheral beams may be set appropriately.

Next, a plurality of peripheral beams of the excessive dose defective beam 10 are divided into a plurality of groups each composed of a preset number of a plurality of peripheral beams. For example, each of the plurality of groups is set to be composed of three adjacent peripheral beams. In the cases B and C, the dose distribution processing unit 61 calculates a plurality of distributed dose amounts for which the gravity center position has been considered. Specifically, it operates as follows: The dose distribution processing unit 61 calculates, for each group of a plurality of groups, each distributed dose amount based on the distance $r_i$ from the irradiation position of the excessive dose defective beam 10 to the irradiation position of each of the three peripheral beams in the group concerned. For example, with respect to three peripheral beams of a group G1 whose irradiation positions are 39a, 39b, and 39c, the distributed dose amount δd1 to the beam of the irradiation position 39a, the distributed dose amount δd2 to the beam of the irradiation position 39b, and the distributed dose amount δd3 to the beam of the irradiation position 39c can be obtained by the equation (4) described above, using the excessive dose Δ, the distance $r_1$ from the irradiation position of the excessive dose defective beam 10 to the irradiation position 39a of a peripheral beam, the distance $r_2$ from the irradiation position of the excessive dose defective beam 10 to the irradiation position 39b of another peripheral beam, and the distance $r_3$ from the irradiation position of the excessive dose defective beam 10 to the irradiation position 39c of another peripheral beam. The same applies to the other groups.

The dose distribution processing unit 61 calculates, for each group, using each calculated distributed dose amount, the gravity center position of a plurality of distributed dose amounts shared by three peripheral beams configuring the group concerned. The gravity center position Gj' of a plurality of distributed dose amounts of each group can be defined by the following equation (5), using a vector distance $r_i$ from the irradiation position of the excessive dose defective beam 10 to the irradiation position of each of the three peripheral beams configuring the group Gj concerned, and a distributed dose amount δdi. j indicates the index of a target group in a plurality of groups. In the equation (5), the gravity center position Gj' is represented by a vector. However, it may be, of course, resolved into an x-direction position dx and a y-direction position dy from the irradiation position of the excessive dose defective beam 10.

$$\vec{G}_j' = \Sigma \vec{r}_i \cdot \delta d_i \tag{5}$$

The dose distribution processing unit 61 selects, from a plurality of groups, a group Gj in which deviation between the gravity center position Gj' and the irradiation position of the excessive dose defective beam 10 is smaller. Then, the dose distribution processing unit 61 performs distribution processing such that the three peripheral beams in a selected group share the excessive dose. When the number of passes is large, the number of a plurality of groups is also large. Then, preferably, calculation is not performed for all the groups, it starts from a preferential group (priorities are determined based on the distance from a defective beam, etc.), and it ends when the gravity center of a required accuracy has been obtained (no calculation is performed for the remaining groups). Specifically, the dose distribution processing unit 61 subtracts a corresponding distributed dose amount δdi from each of doses D of selected three peripheral beams.

In contrast, in the case A in which the excessive dose defective beam 10 is located outside the pattern, since the peripheral beams are also located outside the pattern, their doses are zero in the first place and dose sharing cannot be performed. If this goes on, shape errors occur in a pattern to be written. Then, according to the first embodiment, the gravity center position for the excessive dose amount is moved to the inside of the pattern. Hereinafter, it will be specifically described.

In the large-dose peripheral-pixel specifying step (S130), the large-dose peripheral-pixel specifying unit 64 specifies, in a plurality of peripheral pixels of the excessive dose defective beam 10, a peripheral pixel (irradiation position) irradiated with a larger dose than that of the other peripheral pixels (irradiation position) inside the pattern.

Figure 17A:
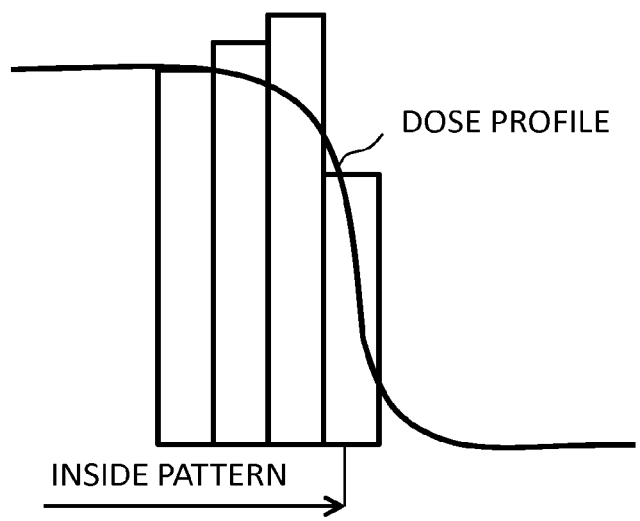
FIGS. 17A to 17C are diagrams showing examples of a relation between a dose profile and a pixel according to the first embodiment.
Figure 17B:
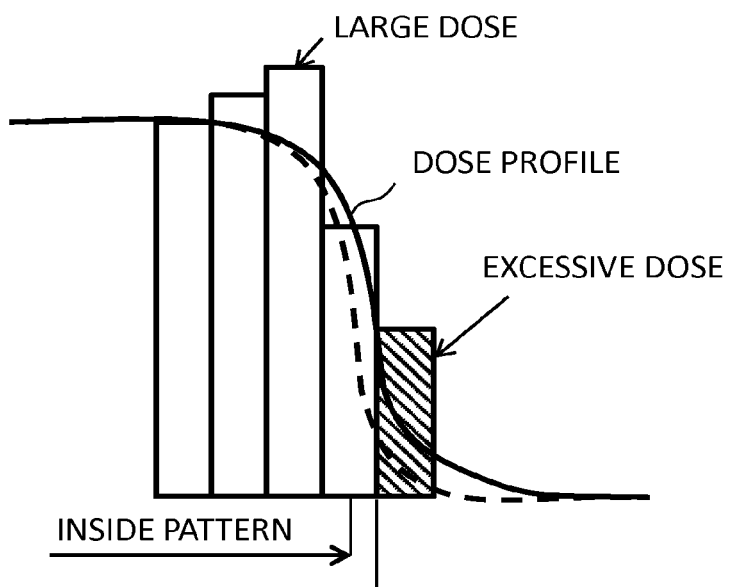
Figure 17C:
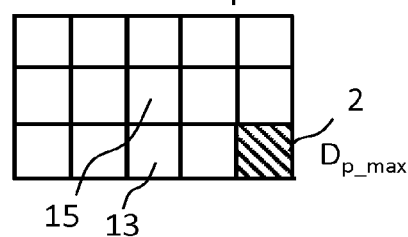

FIGS. 17A to 17C are diagrams showing examples of a relation between a dose profile and a pixel according to the first embodiment. If there is no excessive dose defective beam, no deviation occurs at the position of the pattern edge as shown in FIG. 17A. However, as shown in FIG. 17B, if the outside of the pattern is irradiated with an excessive dose due to the excessive dose defective beam 10, the position of the pattern edge becomes deviated. FIG. 17C shows a pixel 2, viewed from the above, irradiated with an excessive dose (here, the maximum dose $D_{pmax}$) due to an ON defective beam. In the example of FIG. 17B, the pixels overlapping with the pattern edge position have large doses. For example, the amount of dose with which the pixels 13 and 15 being inner from the edge but one pixel are irradiated is large. In such a case, the large-dose peripheral-pixel specifying unit 64 specifies these pixels 13 and 15 as peripheral pixels irradiated with a larger dose than that of the other peripheral pixels (irradiation positions) inside the pattern. In addition, when specifying and determining a peripheral pixel, first, it is required to be located close to the excessive dose defective beam. It is more efficient to select a large-dose beam from the beams close to the excessive dose defective beam.

Figure 18A:
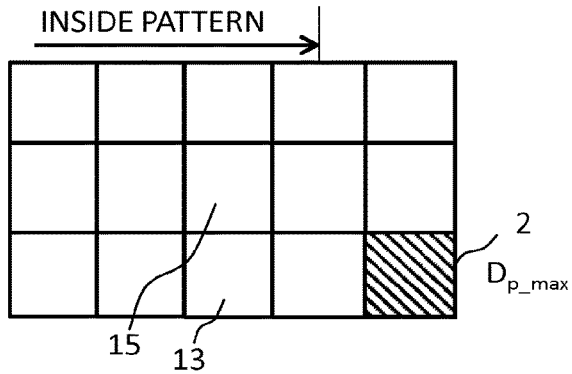
FIGS. 18A to 18C are diagrams showing examples of an additional dose allocation and a gravity center position according to the first embodiment.
Figure 18B:
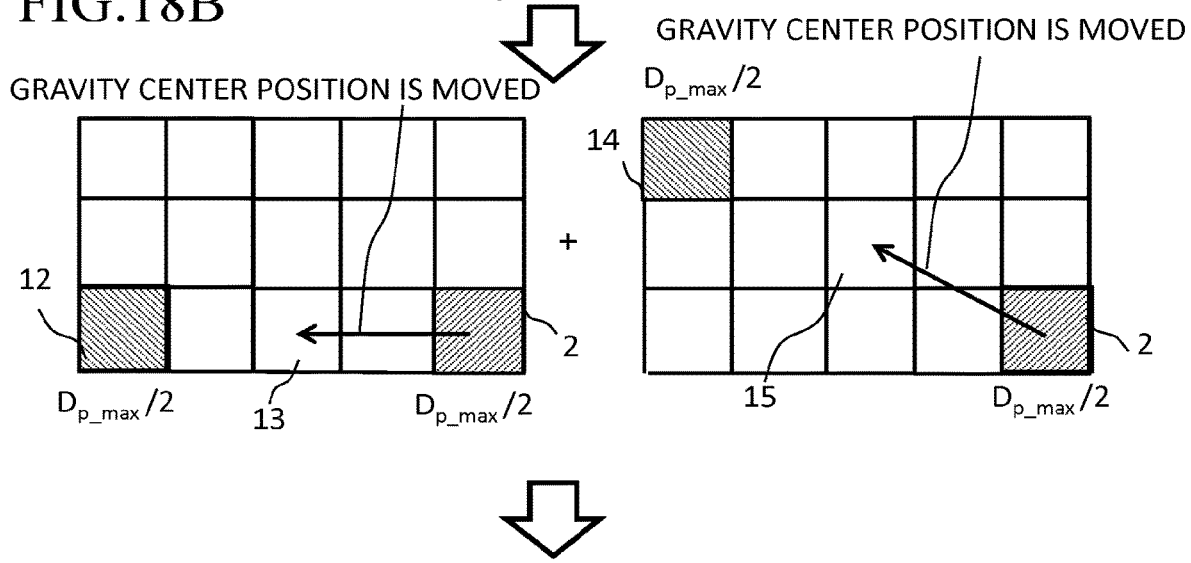
Figure 18C:
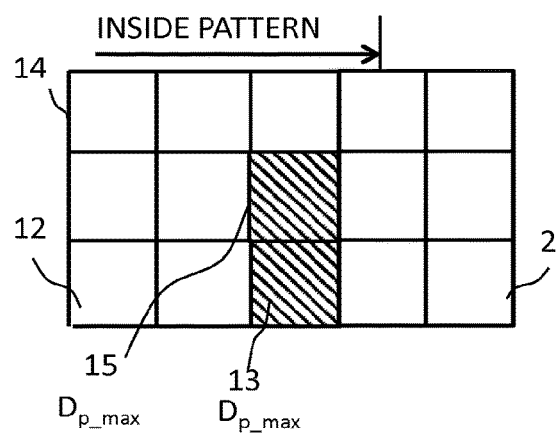

In the additional dose allocation step (S132), the allocation unit 65 (additional dose allocation unit) allocates/assigns an additional dose to a position inside a writing target pattern in order to change the dose distribution (first dose distribution) by an excessive dose, generated on the target object 101 by applying, in the multiple beams 20, the excessive dose defective beam 10 whose irradiation dose is excessive because a beam dose cannot be controlled to a position where a dose for cancelling out (or "offsetting") the excessive dose is insufficient in the range of the excessive dose being spread, to a combined dose distribution (second dose distribution) whose center (e.g., gravity center position) is located inside the writing target pattern and for which beam irradiation canceling out (or "offsetting") the excessive dose and being in the range of the dose distribution (first dose distribution) exists. As the position where the dose for offsetting the excessive dose is insufficient within the range of spreading of the excessive dose, for example, it can be the vicinity of the end of a pattern to be written. For example, it can be a position within the range of two to three beams from the pattern end. For example, in the case A, the additional dose, which is for moving the center of the dose distribution generated on the target object 101 (substrate) by the irradiation outside the pattern to a position inside the pattern, is allocated to the position inside the pattern. For example, in the cases B and C, the additional dose, which is for moving the center of the dose distribution generated on the target object 101 (substrate) by the irradiation on the pattern edge 11 or in the vicinity of the pattern edge 11 to a position inside the pattern, is allocated to the position inside the pattern. The allocation unit 65 allocates an additional dose so that, in a plurality of peripheral pixels of the excessive dose defective beam 10, a peripheral pixel (irradiation position) irradiated with a larger dose than that of the other peripheral pixels (irradiation positions) inside the pattern may be the center (e.g., gravity center position) of a new dose distribution (combined dose distribution to be described later). In that case, the allocation unit 65 allocates the additional dose not to exceed a pre-set dose threshold. As the dose threshold, it is preferable to set a value about ½ of the maximum dose $D_{pmax}$, for example. Specifically, it operates as follows:

FIGS. 18A to 18C are diagrams showing examples of an additional dose allocation and a gravity center position according to the first embodiment.

Figure 19:
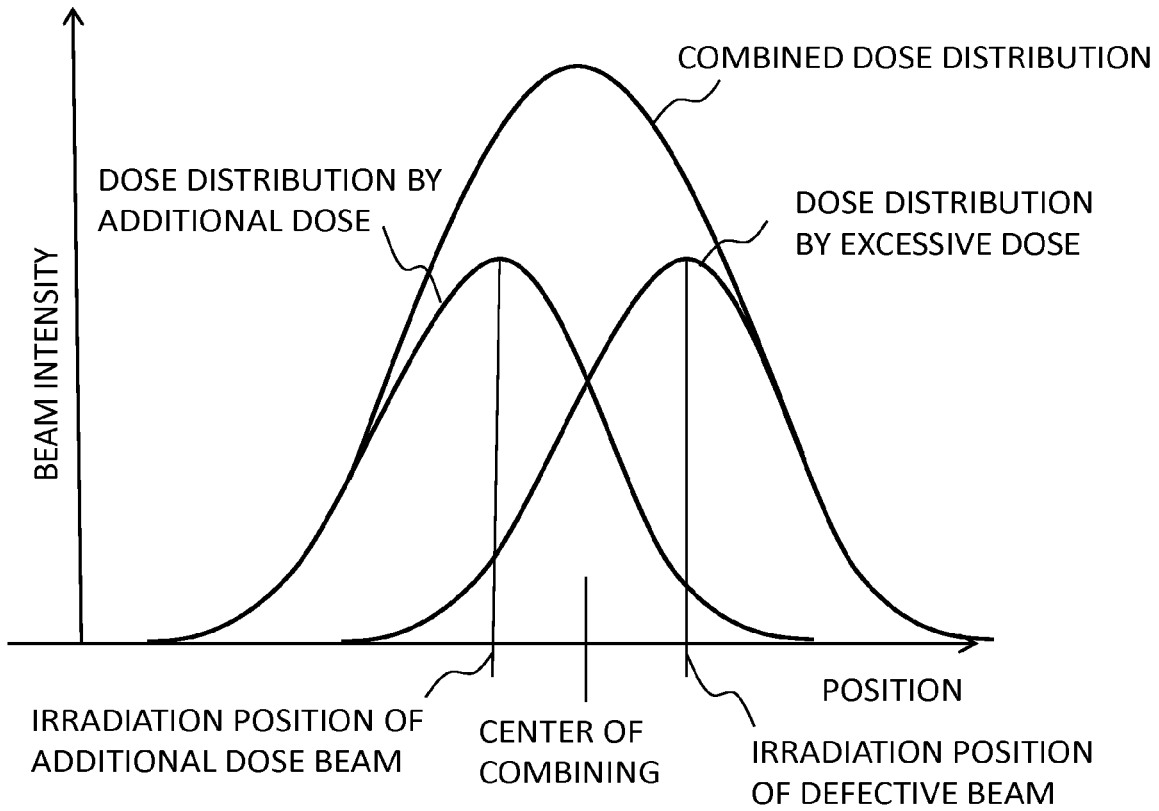
FIG. 19 is a graph showing an example of a dose distribution by an excessive dose, a dose distribution by an additional dose, and their combined dose distribution according to the first embodiment.

FIG. 19 is a graph showing an example of a dose distribution by an excessive dose, a dose distribution by an additional dose, and their combined dose distribution according to the first embodiment. In FIG. 18A, a pixel 2 outside the pattern is irradiated with an excessive dose (here, the maximum dose $D_{pmax}$). If this goes on, the gravity center position of the excessive dose is located in the pixel 2. Then, as shown in FIG. 18B, an additional dose is allocated to a peripheral pixel 12 which is inside the pattern and away from the pixel 2 outside the pattern by four pixels in the −x direction, for example. For example, the maximum dose $D_{pmax}$ similarly to the case of the pixel 2 is allocated. Alternatively, if it exceeds a preset maximum dose when the maximum dose $D_{pmax}$ is allocated, for example, $D_{pmax}/2$ being ½ of the maximum dose is allocated as an additional dose to the peripheral pixel 12. Then, since the additional dose to be allocated to the peripheral pixel 12 has been reduced, an additional dose corresponding to the reduced dose is also allocated to another peripheral pixel. In the example of FIG. 18B, in addition to allocating to the peripheral pixel 12, an additional dose is allocated to a peripheral pixel 14 which is inside the pattern and away from the pixel 2 outside the pattern by four pixels in the −x direction and by two pixels in the y direction. As an additional dose to be allocated to the peripheral pixel 14, the dose remaining after allocation to the peripheral pixel 12 is allocated. For example, $D_{pmax}/2$ being ½ of the maximum dose is allocated. By these additional doses, as shown in FIG. 18C, the gravity center position of the excessive dose located at the pixel 2 can be moved to a peripheral pixel 13 located at the intermediate position between the pixel 2 and the pixel 12, and a peripheral pixel 15 located at the intermediate position between the pixel 2 and the pixel 14. In other words, with respect to the dose distribution by an excessive dose shown in FIG. 19, another dose distribution by an additional dose is generated by allocating the additional dose to the peripheral pixel 12 (14) in the range of the dose distribution by the excessive dose. By this, the dose distribution which affects a pattern formed on the target object 101 can be converted from the dose distribution by an excessive dose to a combined dose distribution shown in FIG. 19 where the dose distribution by the excessive dose and a dose distribution by an additional dose are combined. That is, thereby, the center of the dose distribution which affects a pattern formed on the target object 101 is moved from the outside of the pattern to the inside of it. Here, in order to make the center (e.g., the gravity center position) of the combined dose distribution located inside the pattern, an additional dose is allocated to the peripheral pixel 12 (14). In FIG. 18C, the center of the combined dose distribution is indicated by the peripheral pixel 13 (15). Thereby, the excessive dose with which the pixel 2 outside the pattern is irradiated can be cancelled. In contrast, if this goes on, the peripheral pixels 13 and 15 are irradiated with excessive doses. Then, next, the excessive doses generated for the peripheral pixels 13 and 15 are cancelled.

In the dose cancelation calculation step (S134), the dose cancelation calculation unit 66 calculates an increased dose amount generated at the center (e.g., the gravity center position) of the dose distribution moved because of an additional dose having been allocated. As shown in FIG. 18C, at each of the peripheral pixels 13 and 15 each being the gravity center position moved because of the additional dose having been allocated, an increased dose of $D_{pmax}$ is apparently generated.

In the cancellation correction step (S136), the correction unit 67 performs correction by subtracting an increased dose amount, generated at the center (e.g., the gravity center position) of a combined dose distribution because of an additional dose being allocated, from the dose with which the center of the combined dose distribution or the vicinity of the center of the combined dose distribution is irradiated. As the vicinity of the center of the combined dose distribution, it is preferable to use, for example, the range of two to three beams from the center of the combined dose distribution. For example, the correction is performed to reduce the increased dose amount from the dose with which the center (e.g., the gravity center position) of the dose distribution having been moved is irradiated in a pass, in multiple writing, different from a pass to which the additional dose is allocated. The center position of the dose distribution after moving, and the position to be irradiated with a beam may be deviated from each other. Alternatively, it is also preferable, with respect to the center position of one dose distribution, to correct doses at irradiation positions of a plurality of beams. In such cases, correction is performed to reduce from the dose with which the vicinity of the center of the dose distribution is irradiated. In the example of FIG. 18C, the increased dose amount $D_{pmax}$ generated at the peripheral pixel 13 of a pass is reduced from the dose of one of the other passes. If the reduction cannot be completed by using one pass, a plurality of passes are used to reduce the increased dose $D_{pmax}$. Similarly, the increased dose $D_{pmax}$ generated at the peripheral pixel 15 of the pass is reduced from the dose of one of the other passes. If the reduction cannot be completed by using one pass, a plurality of passes are used to reduce the increased dose $D_{pmax}$. According to the first embodiment, since the peripheral pixels 13 and 15 which are originally irradiated with a larger dose than that of the other peripheral pixels (irradiation positions) are intentionally selected as the gravity center position after moving, the possibility (risk) of not completely reducing the increased dose $D_{pmax}$ only to be remained can be lessened. If the reduction can be completed using the same pass, it is also preferable to reduce the increased dose $D_{pmax}$ from the dose of the same pass.

In the determination step (S138), the determination unit 63 determines whether the excessive doses of all the excessive dose defective beams have been canceled out (offset). If there is an excessive dose defective beam for which the cancelling out (offsetting) has not been completed, it returns to the determination step (S120), and each step needs to be repeated until the excessive doses of all the excessive dose defective beams have been canceled out (offset).

In the examples described above, the maximum dose $D_{pmax}$ within the irradiation time is used as a dose amount applied by an excessive dose defective beam, however, it is not limited thereto. It is preferable that the value obtained by adding the dose during the settling time for beam deflection to the maximum dose $D_{pmax}$ within the irradiation time is used as a dose by an excessive dose defective beam. Alternatively, it is also preferable to further include the dose during a switching time necessary for switching processing from a pixel to be irradiated to a next pixel to be next irradiated, and a data transfer time.

In the irradiation time calculation step (S140), the irradiation time calculation unit 72 calculates an irradiation time t corresponding to the dose for each pixel of each pass, for which beam positional deviation has been corrected, and an insufficient dose by an insufficient dose defective beam and an excessive dose by an excessive dose defective beam have been cancelled out (offset). The irradiation time t can be obtained by dividing the dose D by a current density. The irradiation time t of each pixel 36 (control grid 27) is calculated as a value within the maximum irradiation time Ttr which is the maximum for irradiation by one shot of the multiple beams 20. Irradiation time data is stored in the storage device 142.

In the writing step (S142), first, the writing control unit 74 rearranges irradiation time data in the order of shot in accordance with the writing sequence. Then, the irradiation time data is transmitted to the deflection control circuit 130 in the order of shot. The deflection control circuit 130 outputs deflection control signals to the DAC amplifier units 132 and 134 in the order of shot while outputting a blanking control signal to the blanking aperture array mechanism 204 in the order of shot. The writing mechanism 150 writes a pattern on the target object 101 by performing multiple writing using the multiple beams 20 including an excessive dose defective beam.

According to the first embodiment, as described above, in multiple beam writing, pattern shape errors due to an excessive dose and/or an insufficient dose can be reduced by a simple method. Further, in multiple beam writing, in the case where a position outside the end of a pattern is irradiated with an excessive dose defective beam, pattern shape errors due to a defective beam can be reduced by a simple method. Therefore, a calculation processing time in dose modulation for correcting pattern shape errors due to an excessive dose can be shortened. Accordingly, the calculation processing for dose modulation and the writing operation can be performed in parallel.

Embodiments have been explained referring to specific examples described above. However, the present invention is not limited to these specific examples. The above examples describe the case where each of the multiple beams 20 individually controls, for each beam, the irradiation time within the maximum irradiation time Ttr for one shot. However, it is not limited thereto. For example, the maximum irradiation time Ttr for one shot is divided into a plurality of sub-shots each having a different irradiation time. Then, for each beam, a combination of sub-shots is selected from the plurality of sub-shots in order that the combination may become the irradiation time for one shot. It is also preferable to control, for each beam, the irradiation time for one shot by continuously applying the same beam irradiation to pixels whose combinations of selected sub-shots are the same as each other.

While the case of inputting a 10-bit control signal for controlling each control circuit 41 has been described above, the number of bits may be suitably set. For example, a 2-bit (or any one of 3 to 9 bit) control signal may be used. Alternatively, a control signal of 11 bits or more may be used.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multi-charged particle beam writing apparatus and multi-charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-charged particle beam writing apparatus comprising:
   a beam forming mechanism configured to form multi-charged particle beams;
   a dose calculation circuit configured to calculate a dose at each position on a target object;
   an additional dose allocation circuit configured to allocate an additional dose to a position inside a writing target pattern in order to change a first dose distribution by an excessive dose, generated on the target object by applying, in the multi-charged particle beams, an excessive dose defective beam whose irradiation dose is excessive because a beam dose cannot be controlled to a position where a dose for cancelling out the excessive dose is insufficient in a range of the excessive dose being spread, to a second dose distribution whose center is located inside the writing target pattern and for which beam irradiation canceling out the excessive dose and being in a range of the first dose distribution exists;
   a correction circuit configured to perform correction by subtracting an increased dose amount, generated at the center of the second dose distribution because of the additional dose being allocated, from a dose with which one of the center of the second dose distribution and a vicinity of the center of the second dose distribution is irradiated; and
   a writing mechanism configured to write a pattern on the target object, using the multi-charged particle beams including the excessive dose defective beam.

2. The apparatus according to claim 1, wherein
   the writing mechanism performs multiple writing, and
   the dose calculation circuit adds an insufficient dose amount at a position irradiated with an insufficient dose defective beam in the multi-charged particle beams, to a dose amount to be applied in different writing processing from writing processing using the insufficient dose amount in the multiple writing.

3. The apparatus according to claim 1, wherein the additional dose allocation circuit allocates the additional dose not to exceed a pre-set dose threshold.

4. The apparatus according to claim 1, wherein the additional dose allocation circuit allocates the additional dose such that an irradiation position irradiated with a larger dose than that of each of peripheral irradiation positions becomes the center of the second dose distribution.

5. The apparatus according to claim 1, wherein, as the irradiation dose applied by the excessive dose defective beam, a value obtained by adding a dose during a settling time for beam deflection to a dose within an irradiation time is used.

6. A multi-charged particle beam writing method comprising:
   forming multi-charged particle beams;
   calculating a dose at each position on a target object;
   allocating an additional dose to a position inside a writing target pattern in order to change a first dose distribution by an excessive dose, generated on the target object by applying, in the multi-charged particle beams, an excessive dose defective beam whose irradiation dose is excessive because a beam dose cannot be controlled to a position where a dose for cancelling out the excessive dose is insufficient in a range of the excessive dose being spread, to a second dose distribution whose center is located inside the writing target pattern and for which beam irradiation canceling out the excessive dose and being in a range of the first dose distribution exists;
   correcting by subtracting an increased dose amount, generated at the center of the second dose distribution because of the additional dose being allocated, from a dose with which one of the center of the second dose distribution and a vicinity of the center of the second dose distribution irradiated; and writing a pattern on the target object, using the multi-charged particle beams including the excessive dose defective beam.

7. The method according to claim 6, wherein
the writing performs multiple writing, and
an insufficient dose amount at a position irradiated with an insufficient dose defective beam in the multi-charged particle beams is added to a dose amount to be applied in different writing processing from writing processing using the insufficient dose amount in the multiple writing.

8. The method according to claim 6, wherein the additional dose is allocated not to exceed a pre-set dose threshold.

9. The method according to claim 6, wherein the additional dose is allocated such that an irradiation position irradiated with a larger dose than that of each of peripheral irradiation positions becomes the center of the second dose distribution.

10. The method according to claim 6, wherein, as the irradiation dose applied by the excessive dose defective beam, a value obtained by adding a dose during a settling time for beam deflection to a dose within an irradiation time is used.

* * * * *